(12) United States Patent
Cayaban et al.

(10) Patent No.: US 9,131,605 B2
(45) Date of Patent: Sep. 8, 2015

(54) DYNAMIC LOOP WITH FOLD

(71) Applicant: NITTO DENKO CORPORATION, Osaka (JP)

(72) Inventors: Alex Enriquez Cayaban, Fremont, CA (US); Martin John McCaslin, Pleasanton, CA (US); Yukimasa Kawato, Bloomington, MN (US)

(73) Assignee: NITTO DENKO CORPORATION, Osaka (JP)

( * ) Notice: Subject to any disclaimer, the term of this patent is extended or adjusted under 35 U.S.C. 154(b) by 190 days.

(21) Appl. No.: 13/897,132

(22) Filed: May 17, 2013

(65) Prior Publication Data

US 2013/0314882 A1    Nov. 28, 2013

Related U.S. Application Data

(60) Provisional application No. 61/651,932, filed on May 25, 2012.

(51) Int. Cl.
 *H05K 1/00*  (2006.01)
 *H05K 1/02*  (2006.01)

(52) U.S. Cl.
 CPC .............. *H05K 1/028* (2013.01); *H05K 1/0216* (2013.01); *H05K 1/0271* (2013.01); *H05K 2201/055* (2013.01)

(58) Field of Classification Search
 CPC .............................. H05K 1/028; H05K 1/0216
 USPC .......................................... 361/749; 174/254
 See application file for complete search history.

(56) References Cited

U.S. PATENT DOCUMENTS

| | | | | |
|---|---|---|---|---|
| 4,845,315 A | * | 7/1989 | Stopper | 361/827 |
| 5,612,840 A | * | 3/1997 | Hiraoka et al. | 360/245.9 |
| 5,644,448 A | * | 7/1997 | Suzuki | 360/99.18 |
| 5,917,158 A | * | 6/1999 | Takao et al. | 174/254 |
| 6,153,832 A | * | 11/2000 | Gaarder | 174/254 |
| RE37,869 E | * | 10/2002 | Suzuki | 360/99.18 |
| 6,969,806 B2 | * | 11/2005 | Dupriest | 174/117 F |
| 8,115,103 B2 | * | 2/2012 | Tokuyama | 174/254 |
| 8,247,699 B2 | * | 8/2012 | Shen | 174/254 |
| 2007/0019076 A1 | * | 1/2007 | Teramoto et al. | 348/207.99 |
| 2008/0074790 A1 | | 3/2008 | Kobayashi | |
| 2009/0009912 A1 | * | 1/2009 | Chin et al. | 360/264.2 |

FOREIGN PATENT DOCUMENTS

| | | |
|---|---|---|
| JP | 2007-258593 A | 10/2007 |
| JP | 2008-80562 A | 4/2008 |
| JP | 2012033816 A * | 2/2012 |

OTHER PUBLICATIONS

International Search Report for International Application No. PCT/JP2013/065122 mailed Sep. 10, 2013.

(Continued)

*Primary Examiner* — Jeremy C Norris
*Assistant Examiner* — Nathan Milakovich
(74) *Attorney, Agent, or Firm* — Sughrue Mion, PLLC

(57) ABSTRACT

A single layer dynamic loop is provided. A single layer dynamic loop includes a set of traces divided by a slit on the single layer dynamic loop, wherein the set of traces are divided into a first region and a second region; and wherein the single layer dynamic loop is folded along the slit to move at least part of the first region in relation to the second region.

19 Claims, 31 Drawing Sheets

Un-Folded Front View

(56) References Cited

OTHER PUBLICATIONS

Notification of Transmittal of the International Search Report and the Written Opinion of the International Searching Authority, or the Declaration for International Application No. PCT/JP2013/065122 mailed Sep. 10, 2013.

Written Opinion of the International Searching Authority for International Application No. PCT/JP2013/065122 mailed Sep. 10, 2013.

* cited by examiner

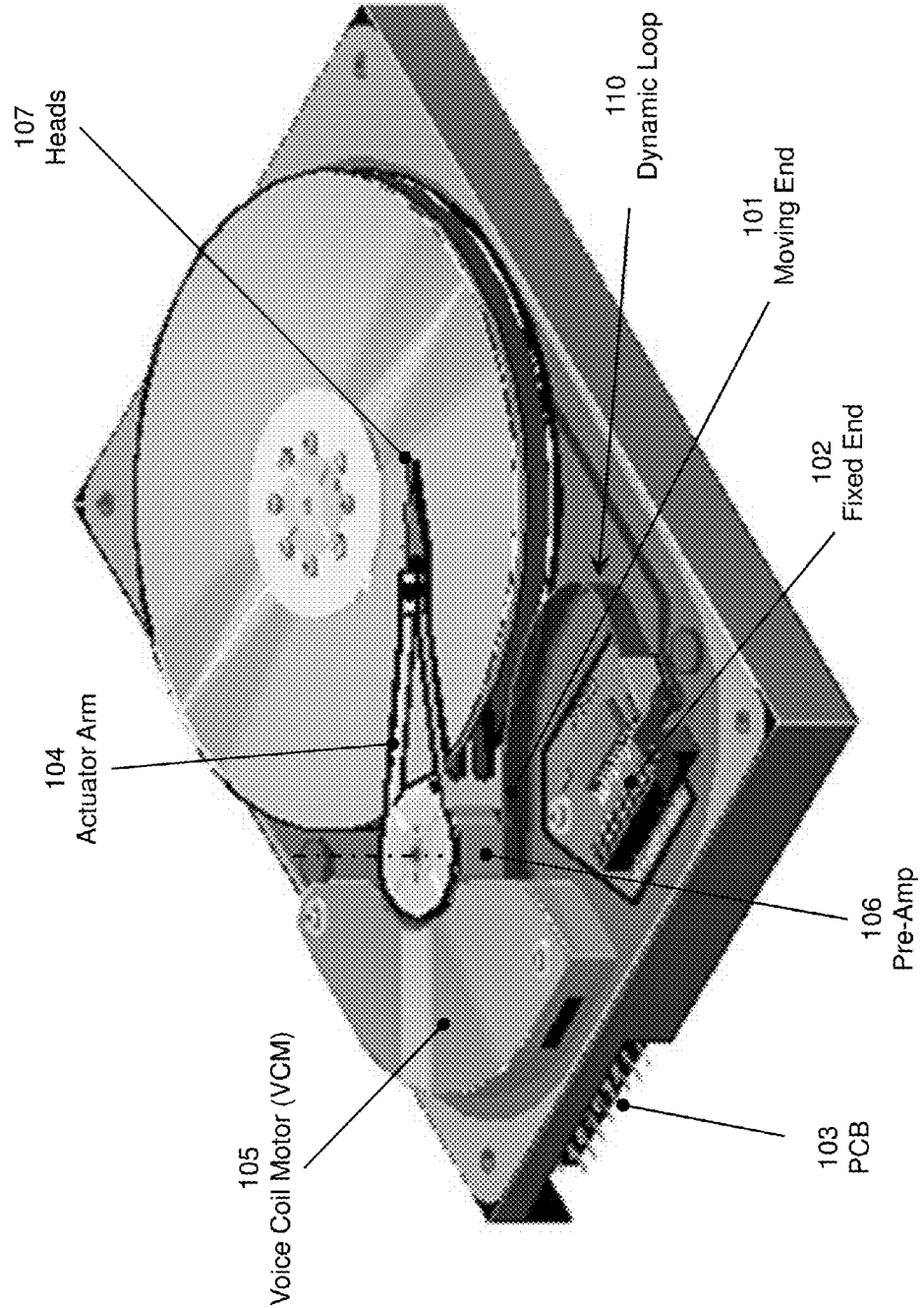

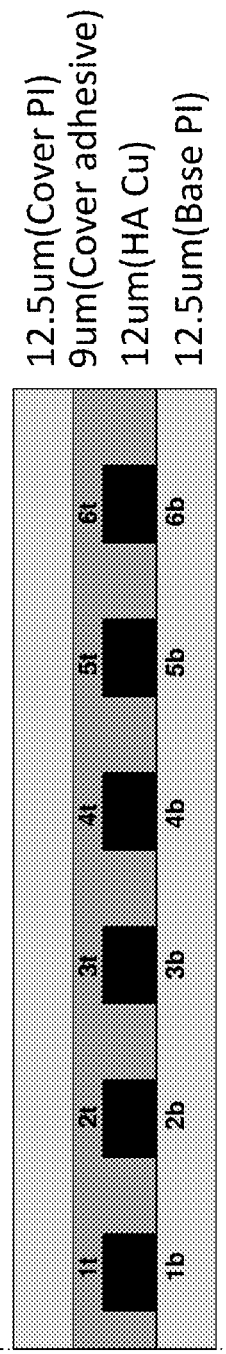
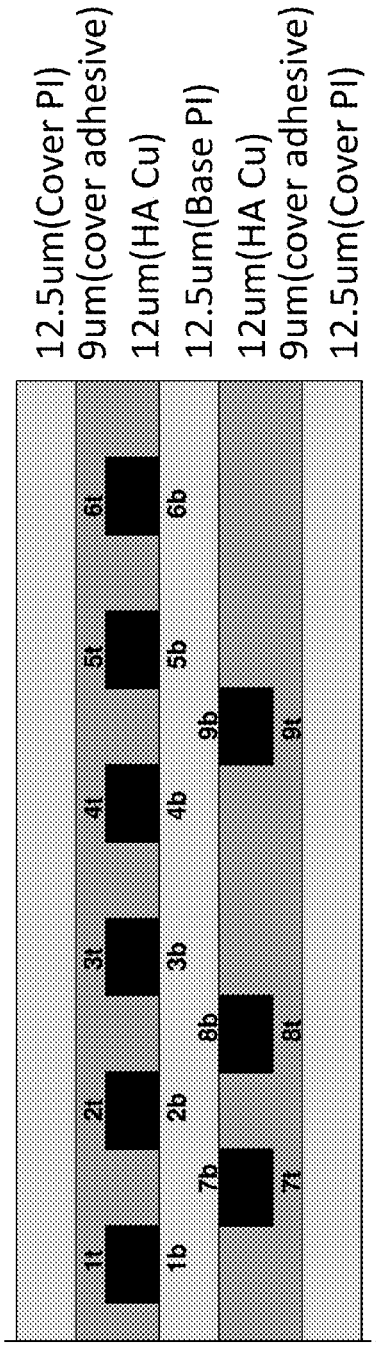
Figure 2A Related Art
Figure 2B Related Art

Related Art

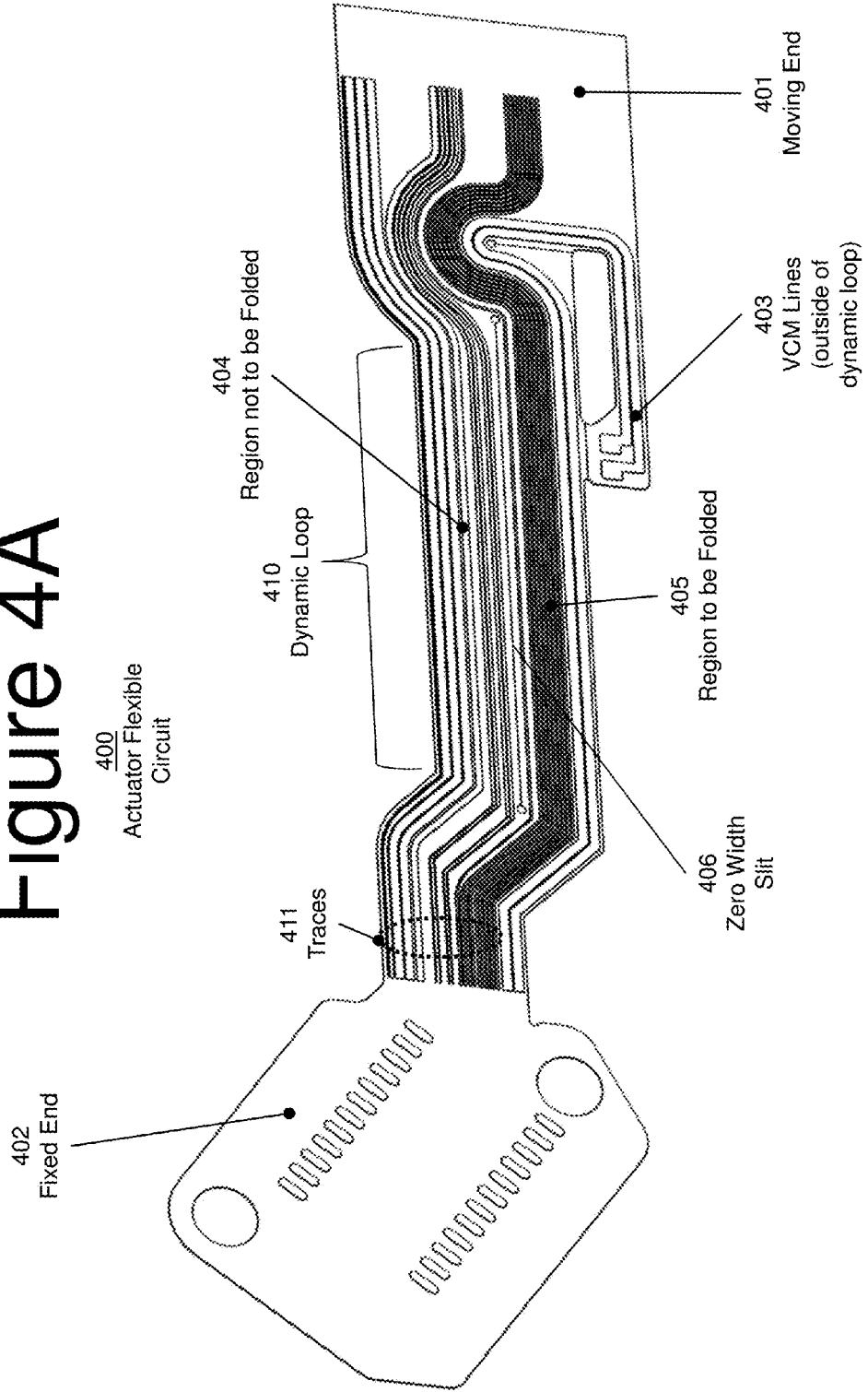

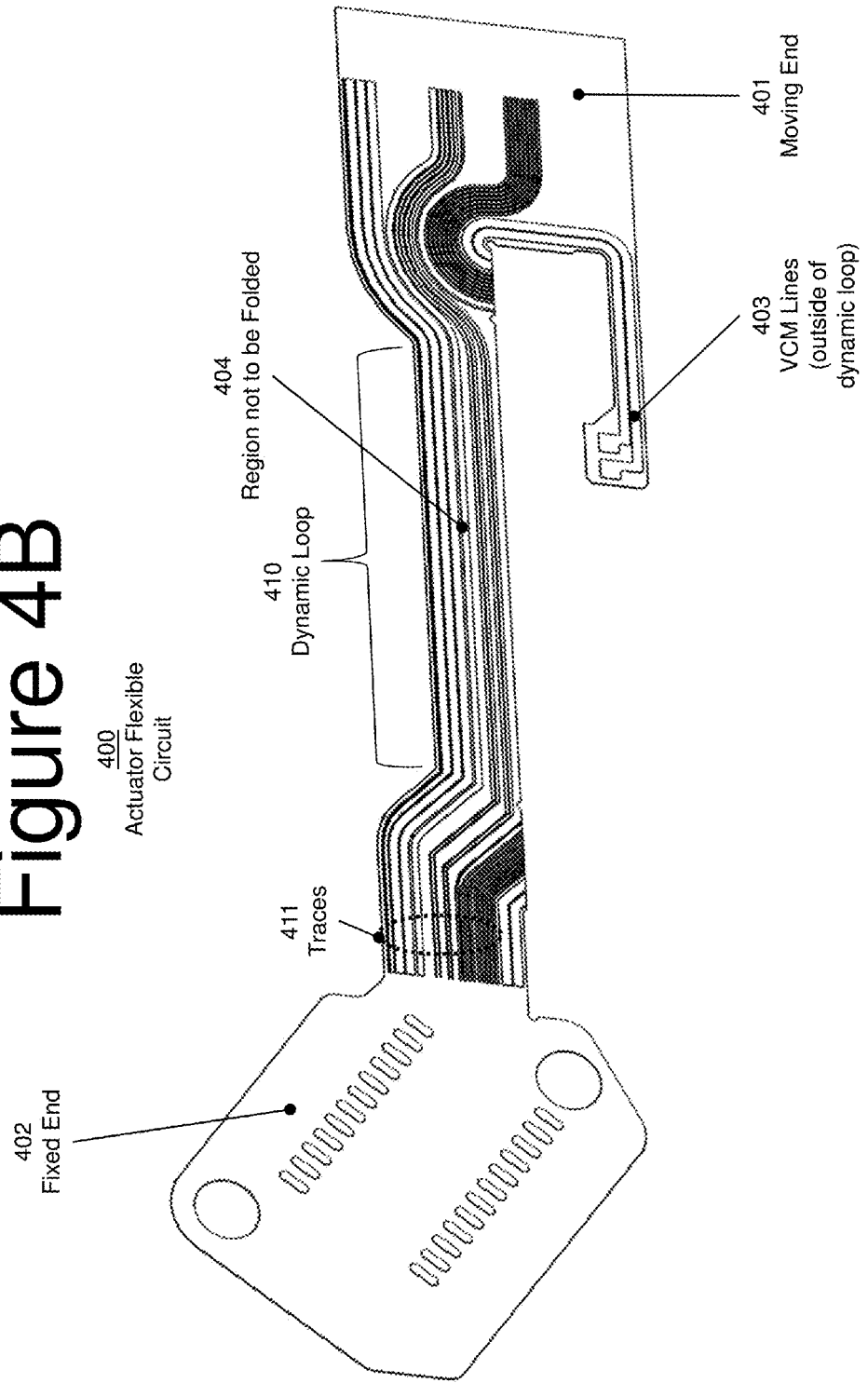

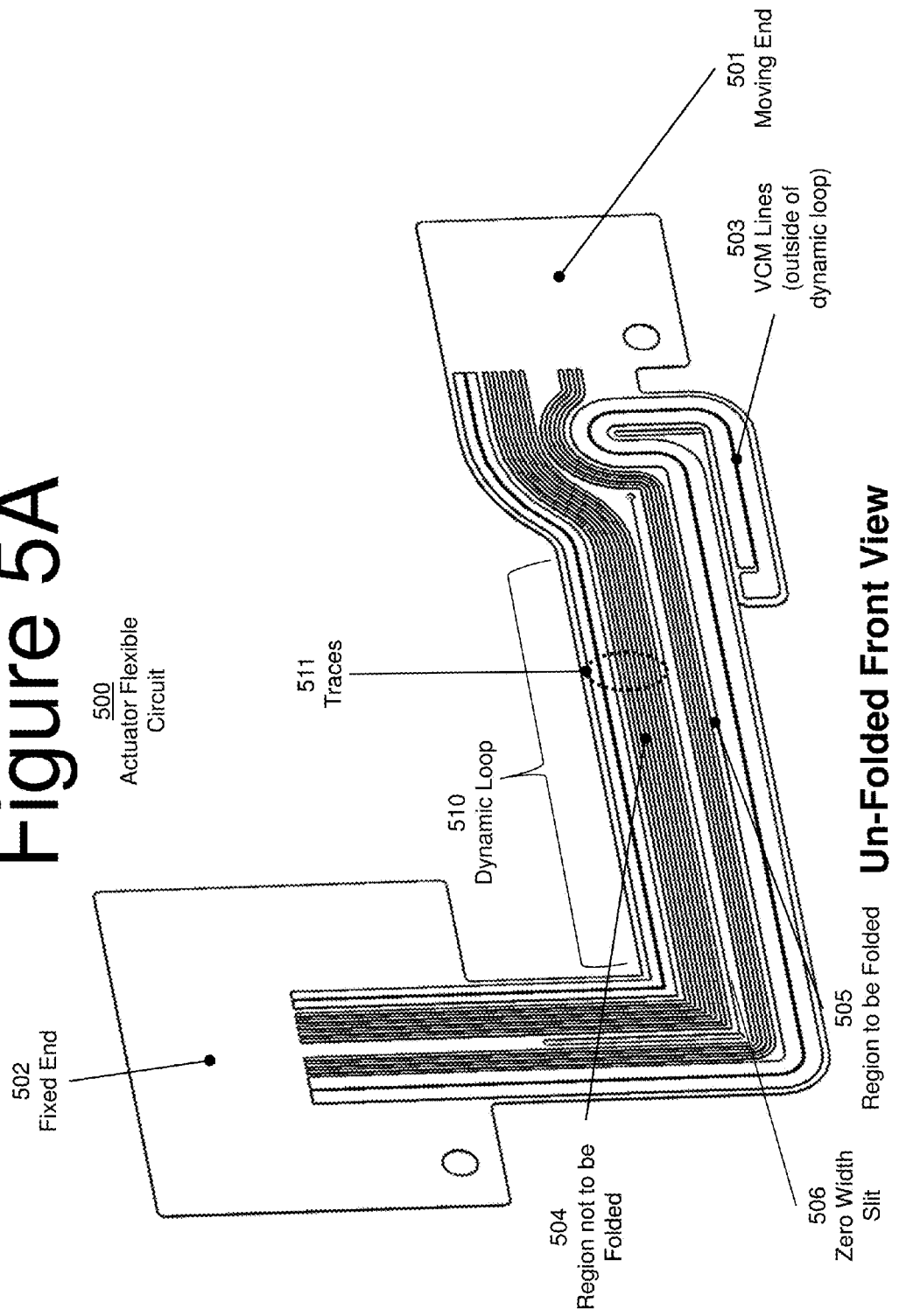

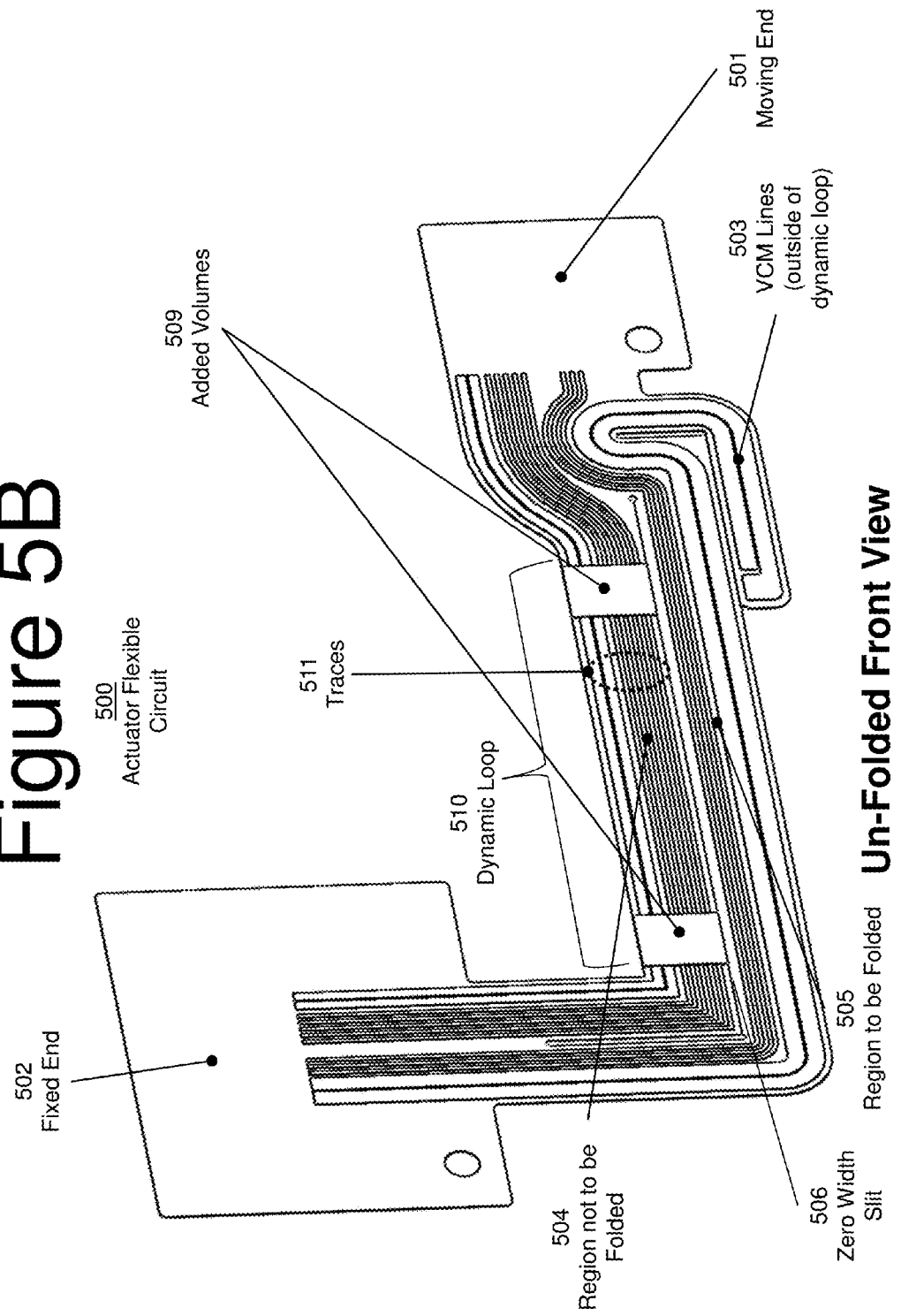

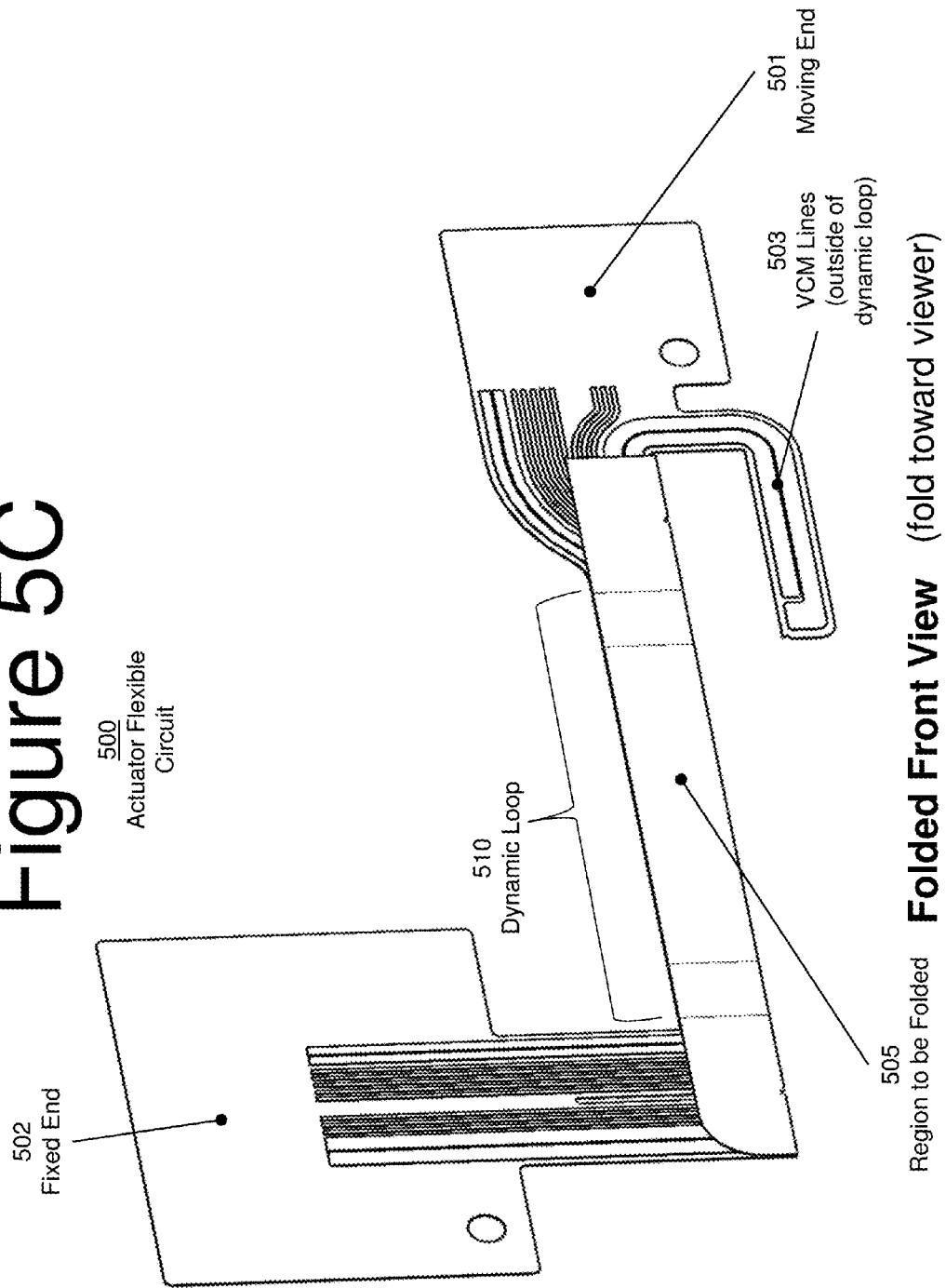

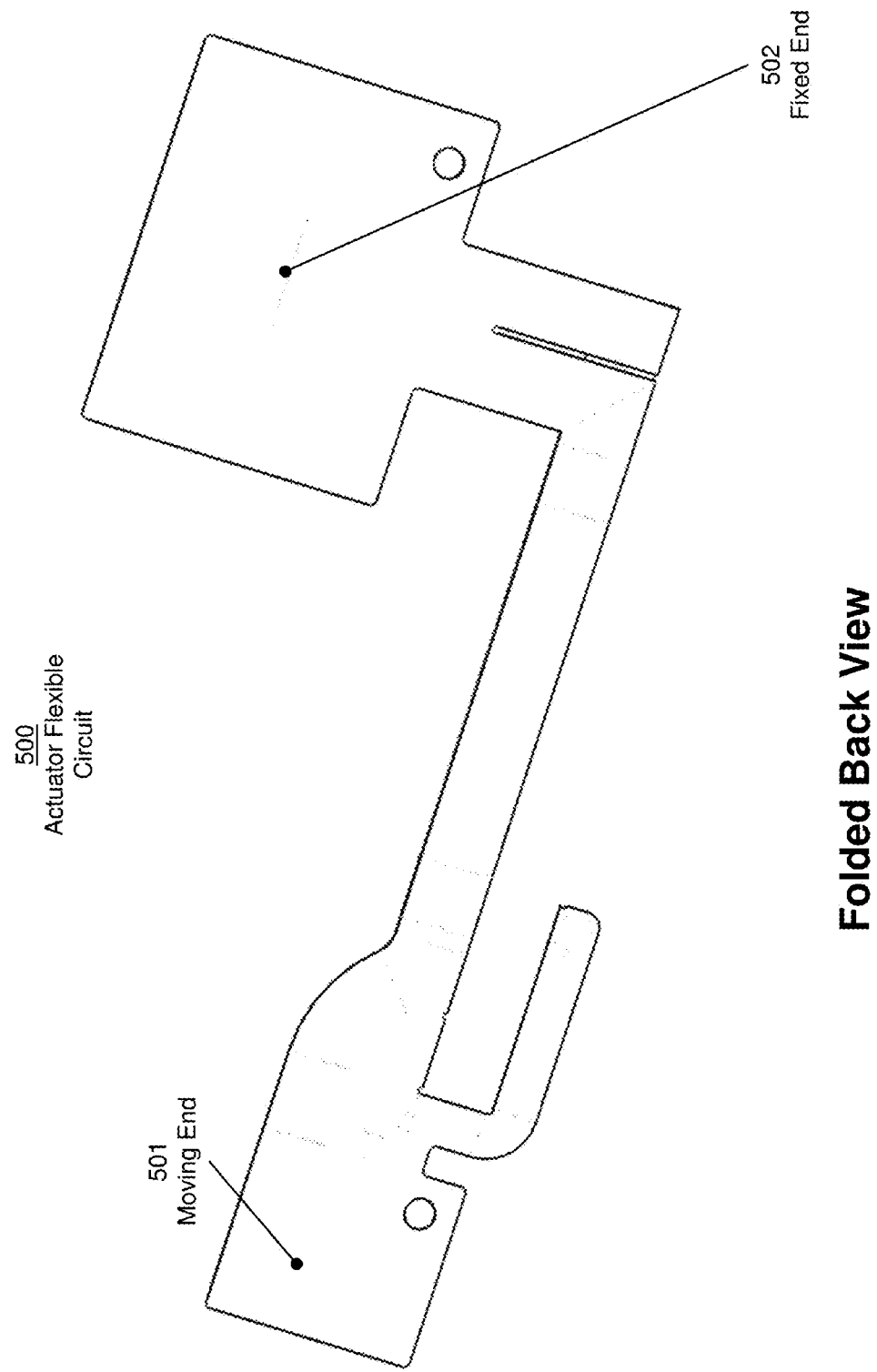

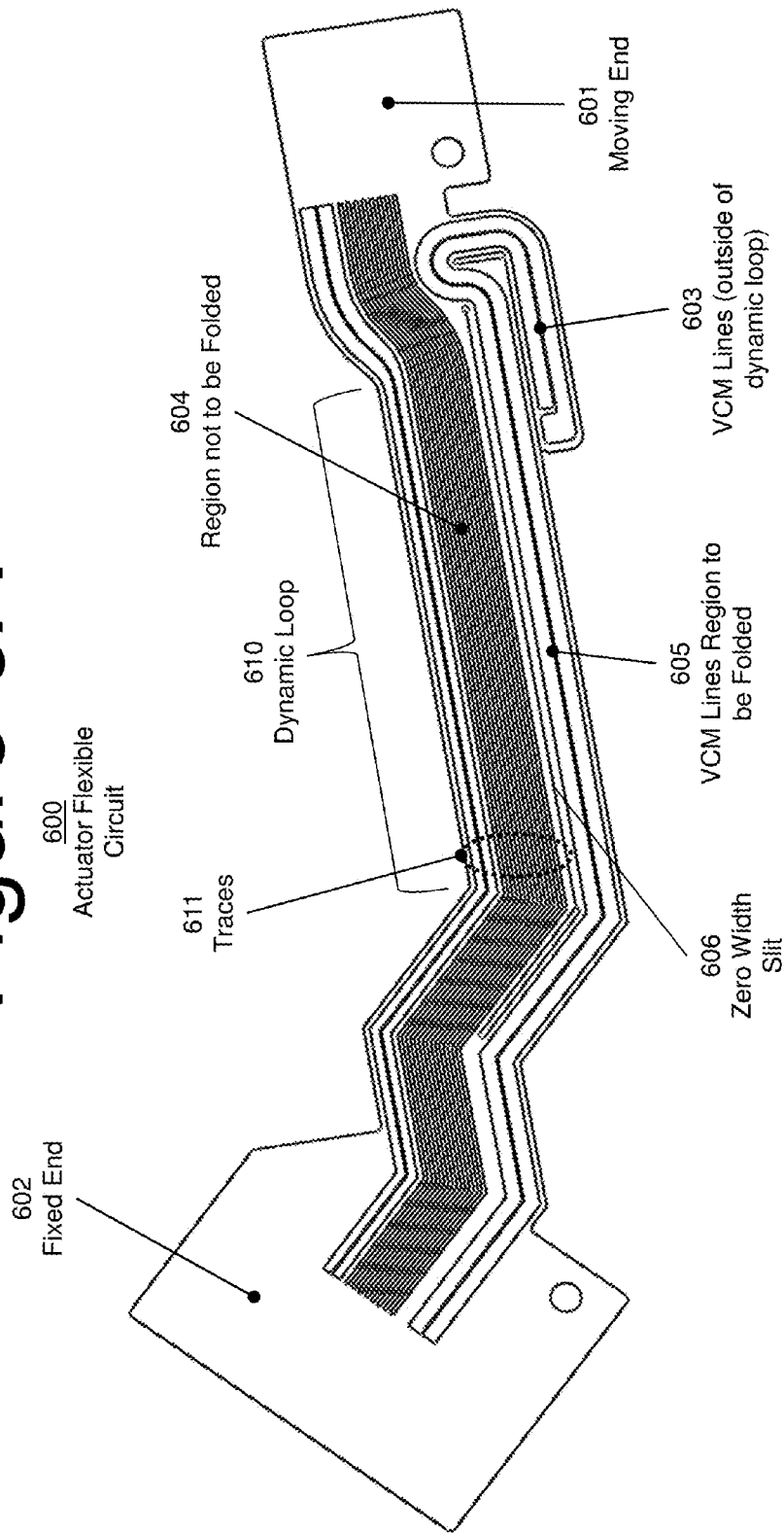

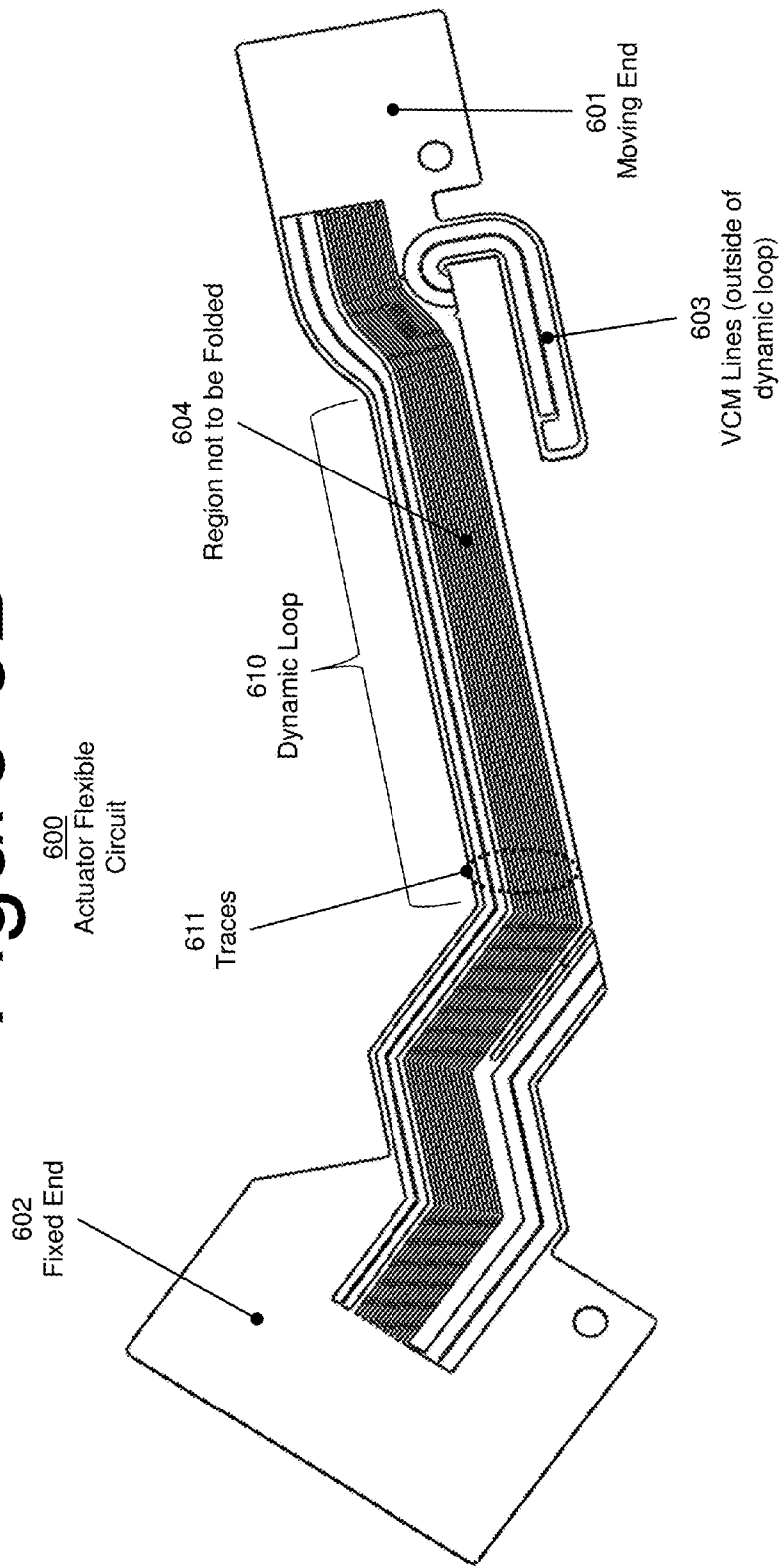
Folded Front View

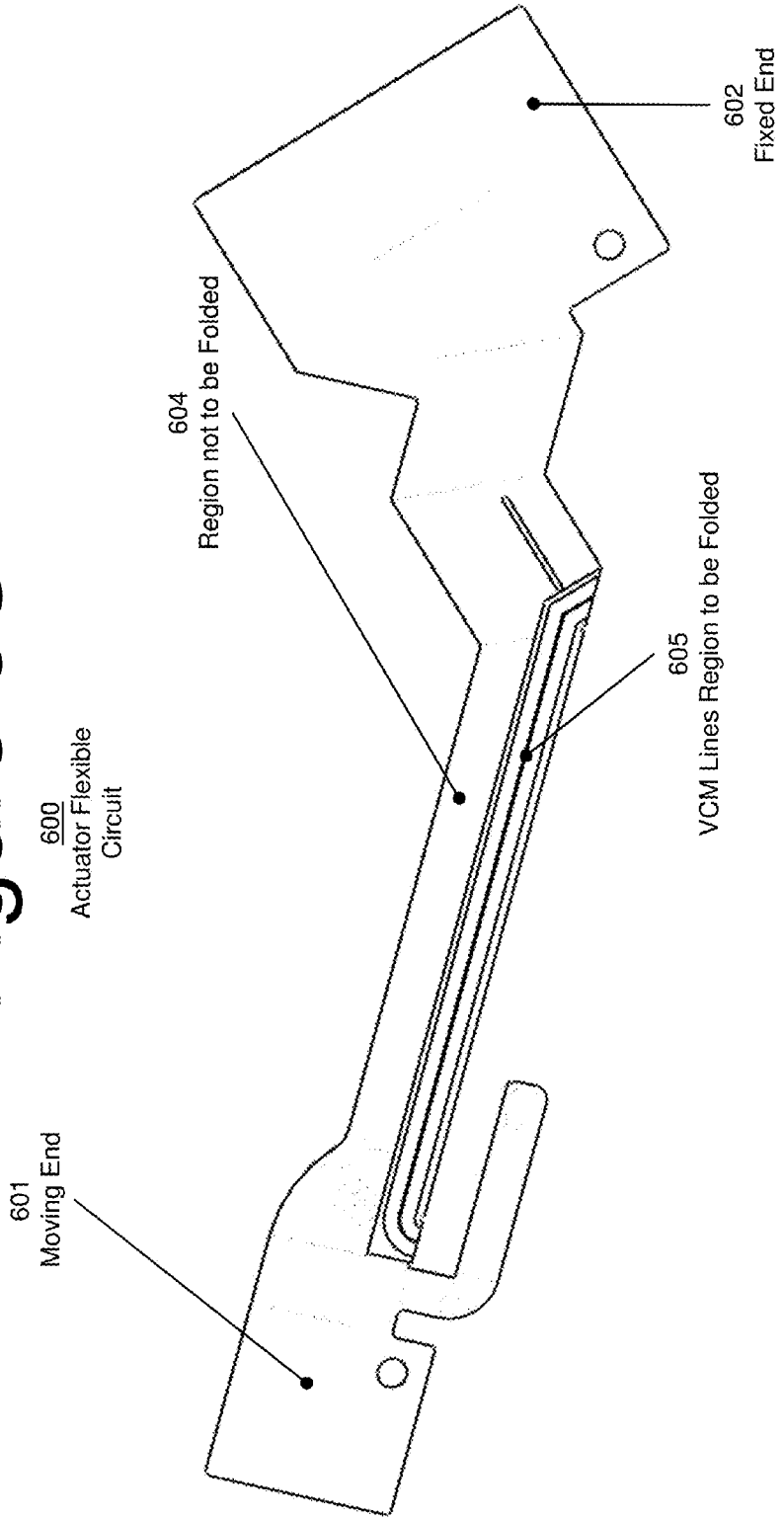

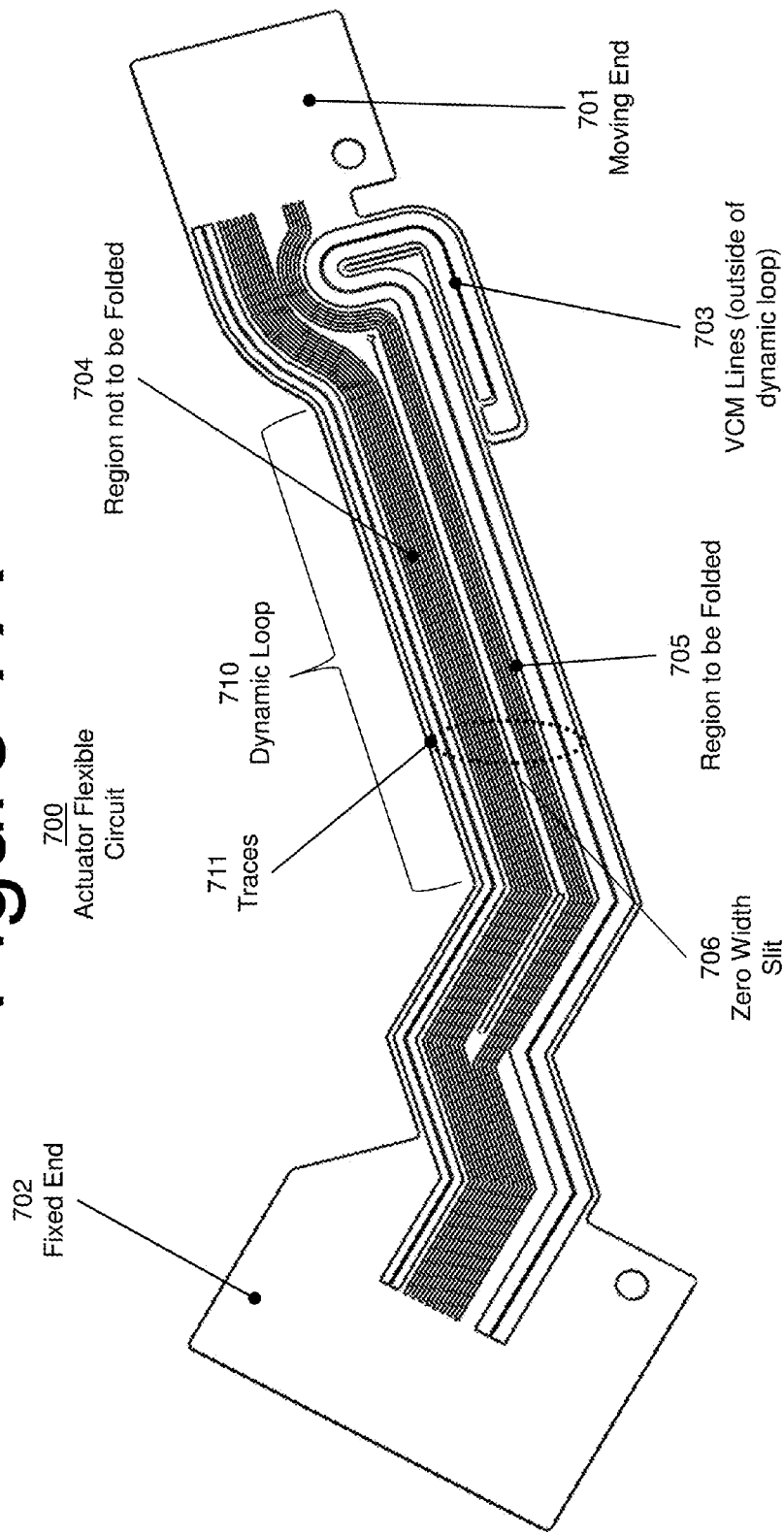

700 Actuator Flexible Circuit
701 Moving End
702 Fixed End
703 VCM Lines (outside of dynamic loop)
704 Region not to be Folded
710 Dynamic Loop
711 Traces Folded Front View (fold away from viewer)

700 Actuator Flexible Circuit
702 Fixed End
705 Region to be Folded
701 Moving End Folded Back View

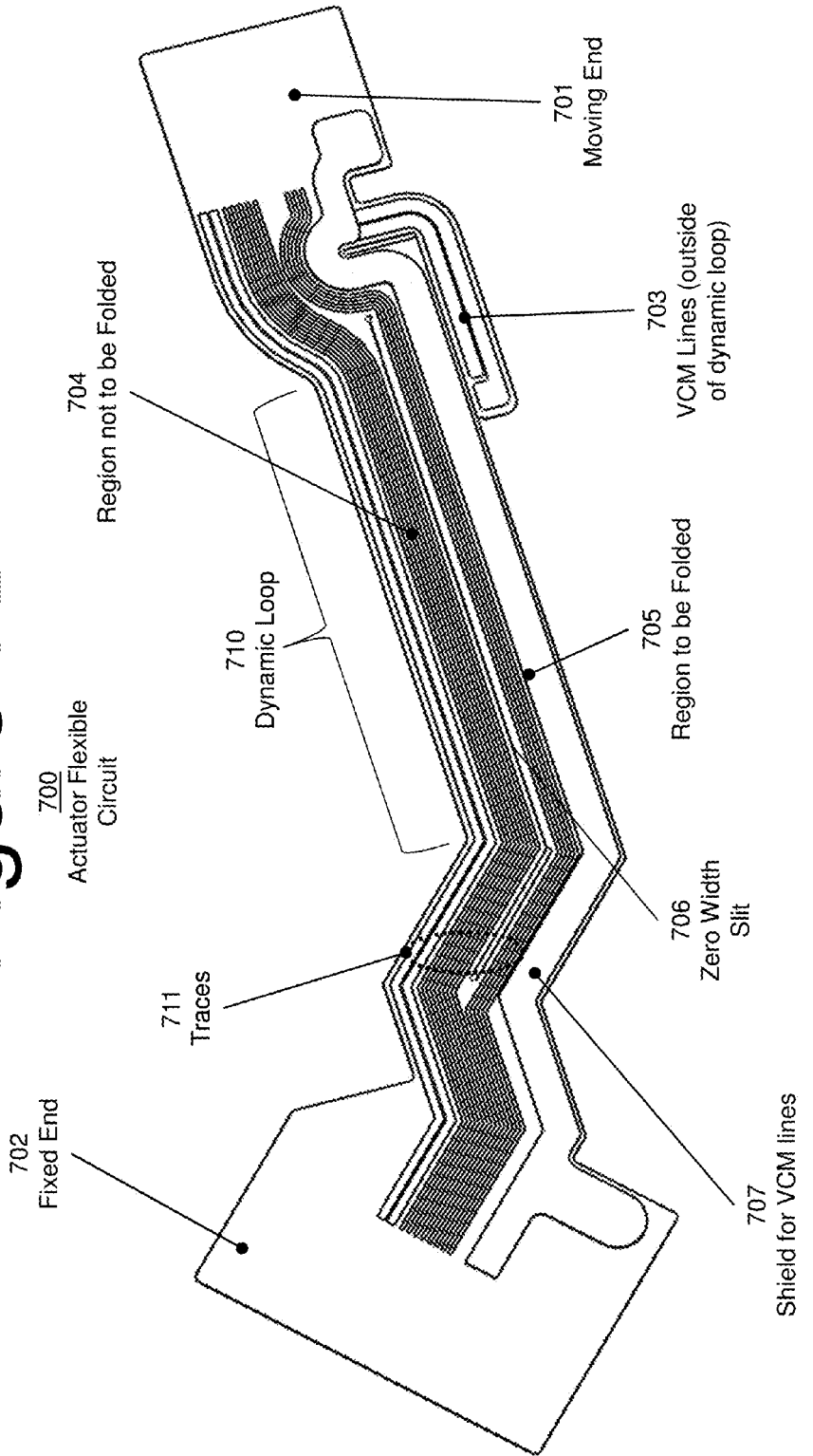

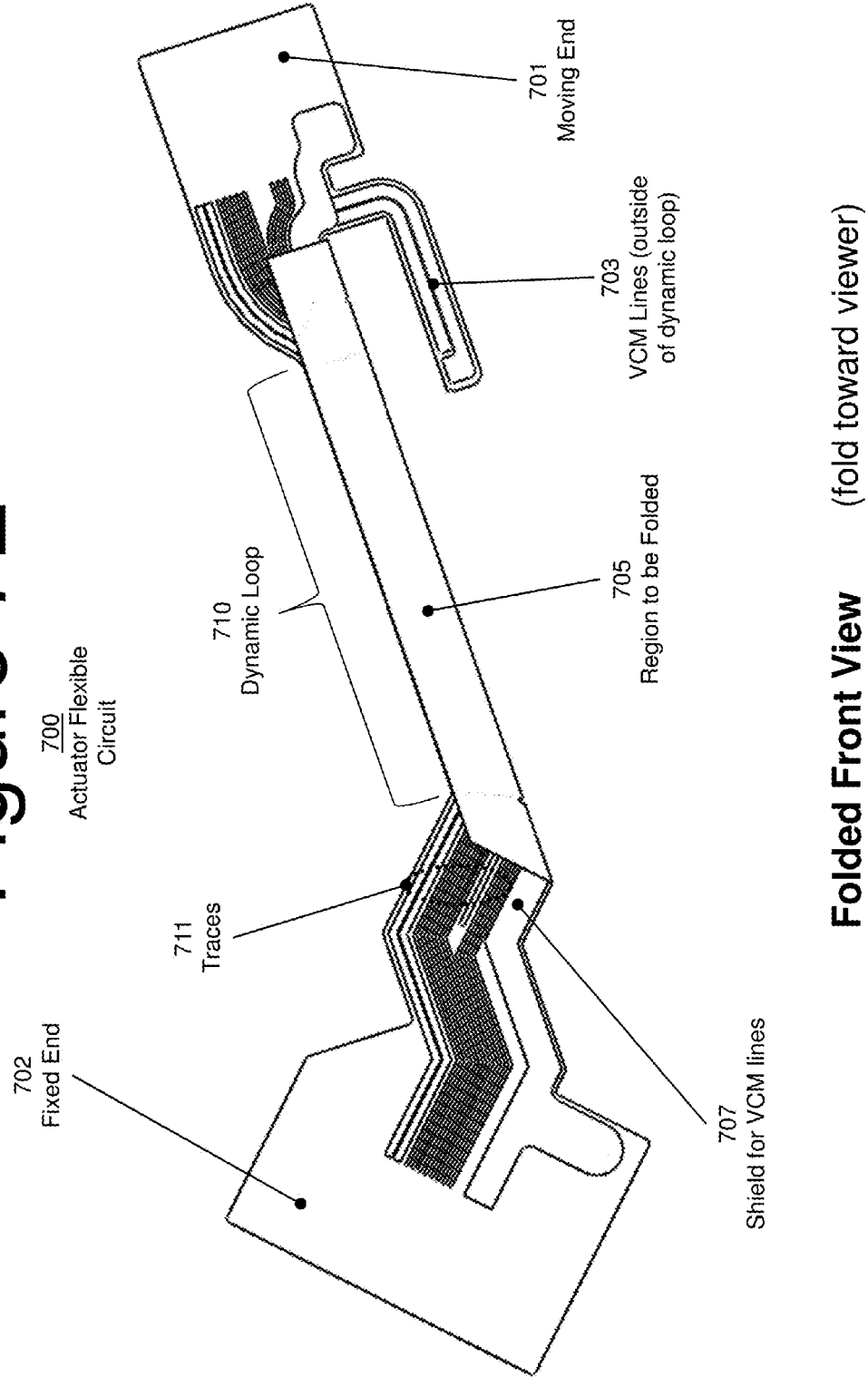

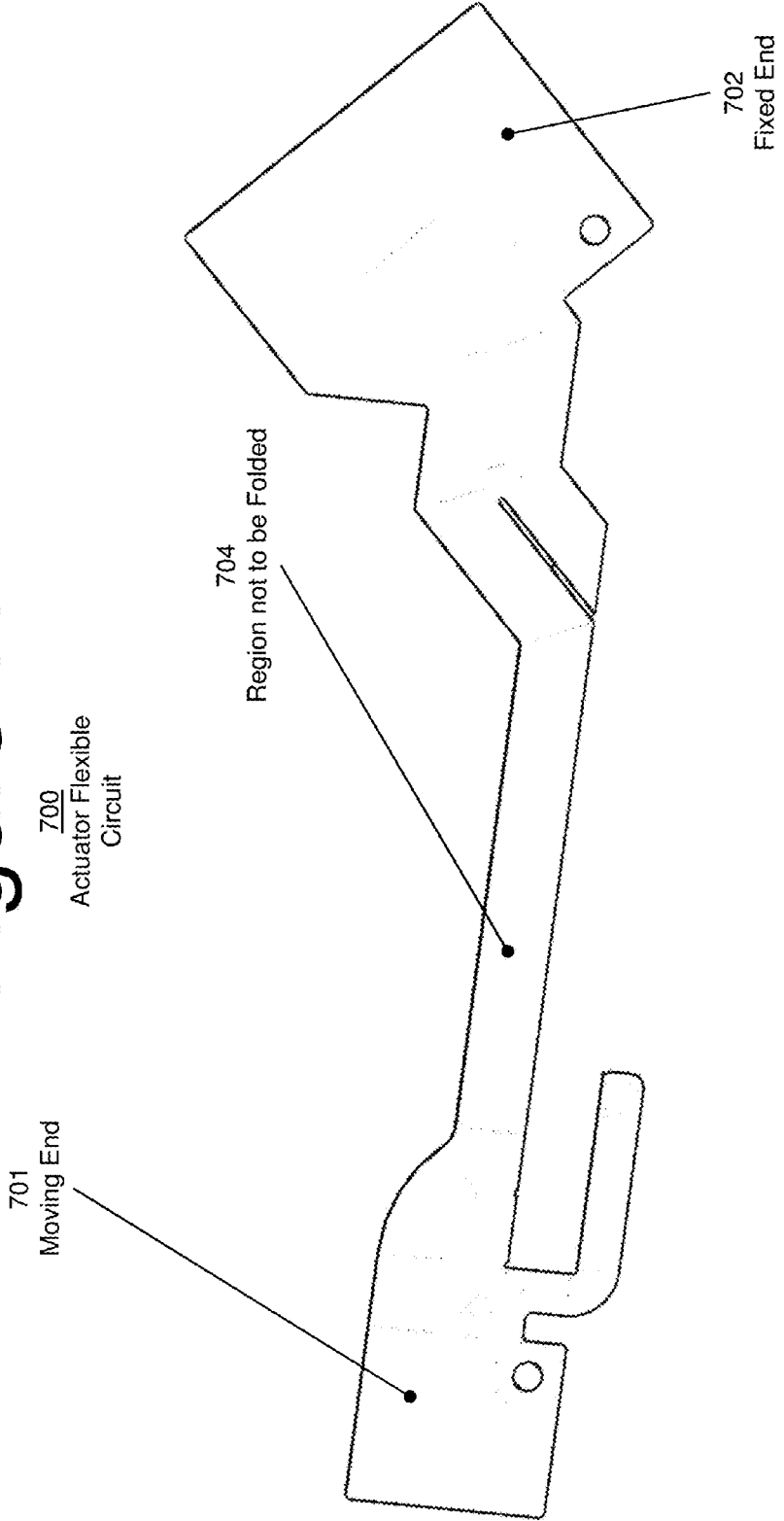

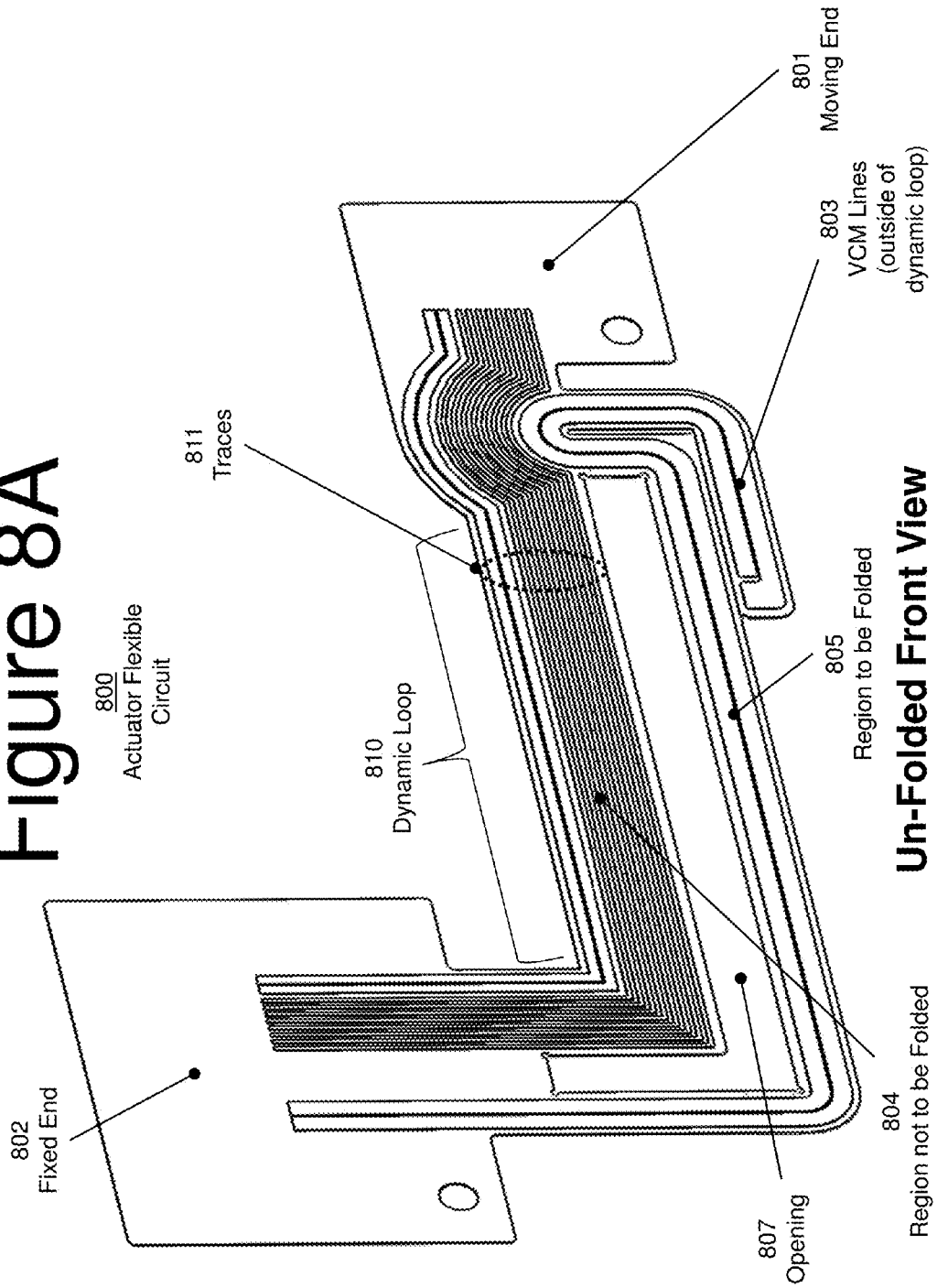

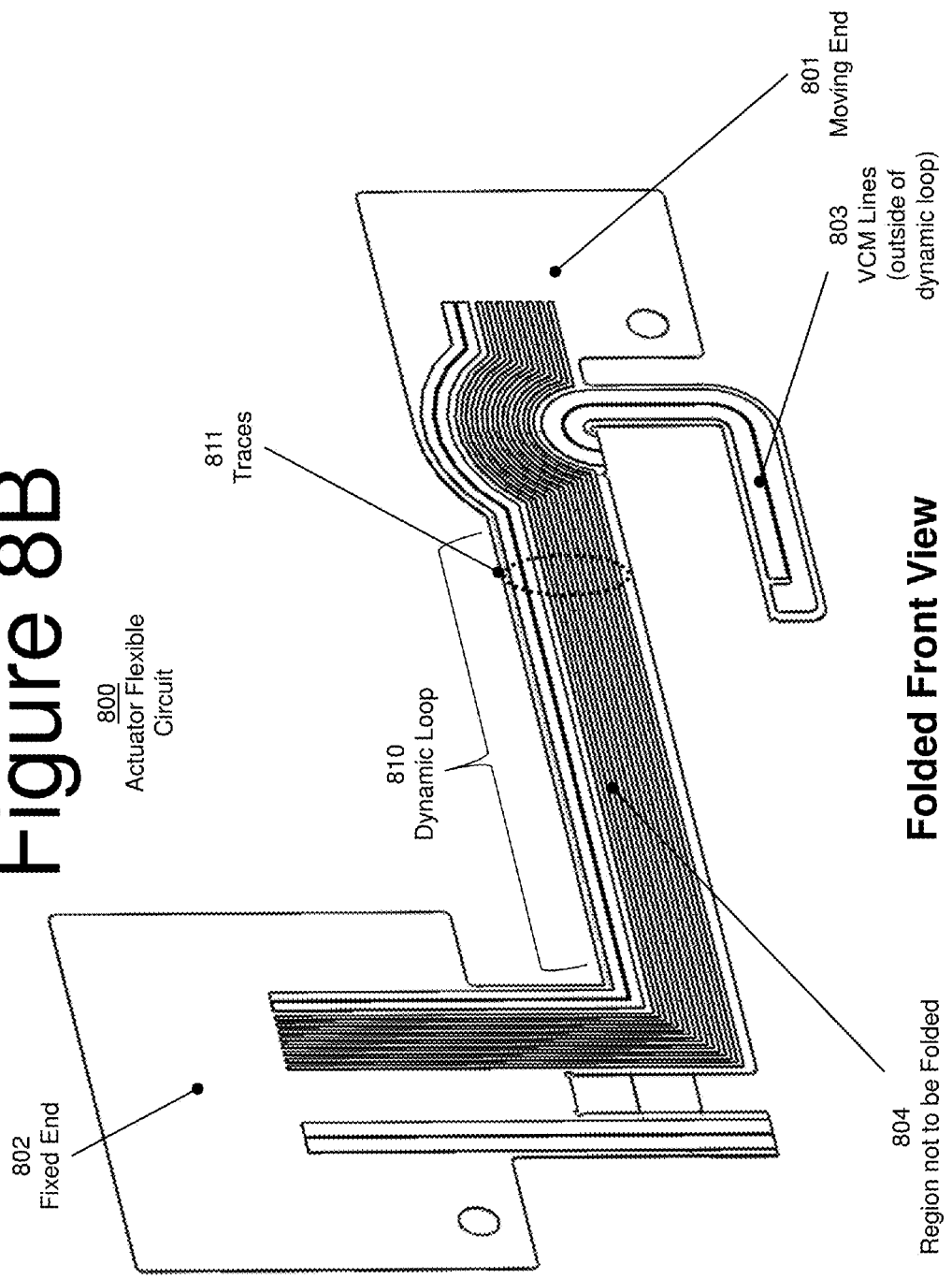

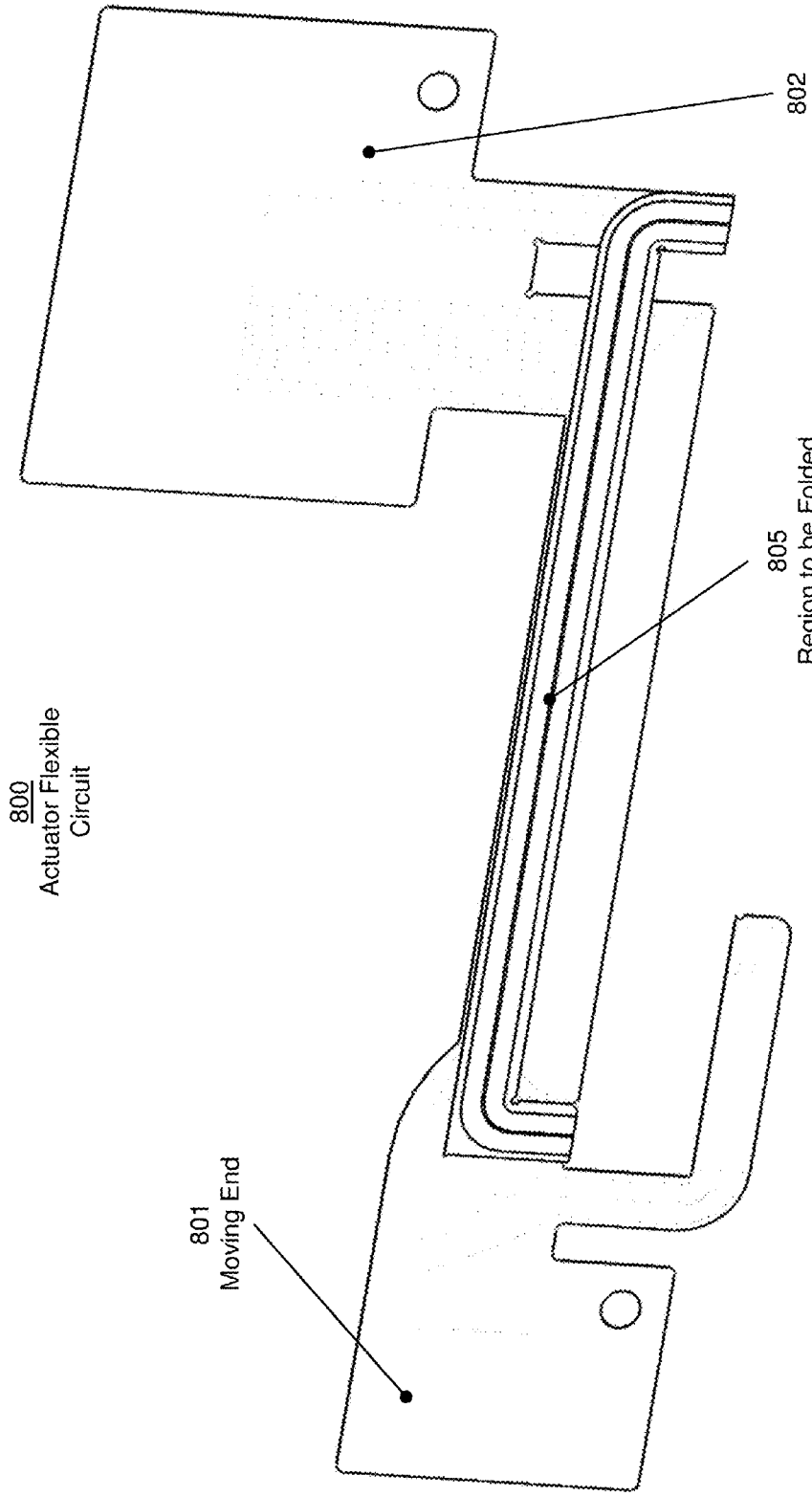

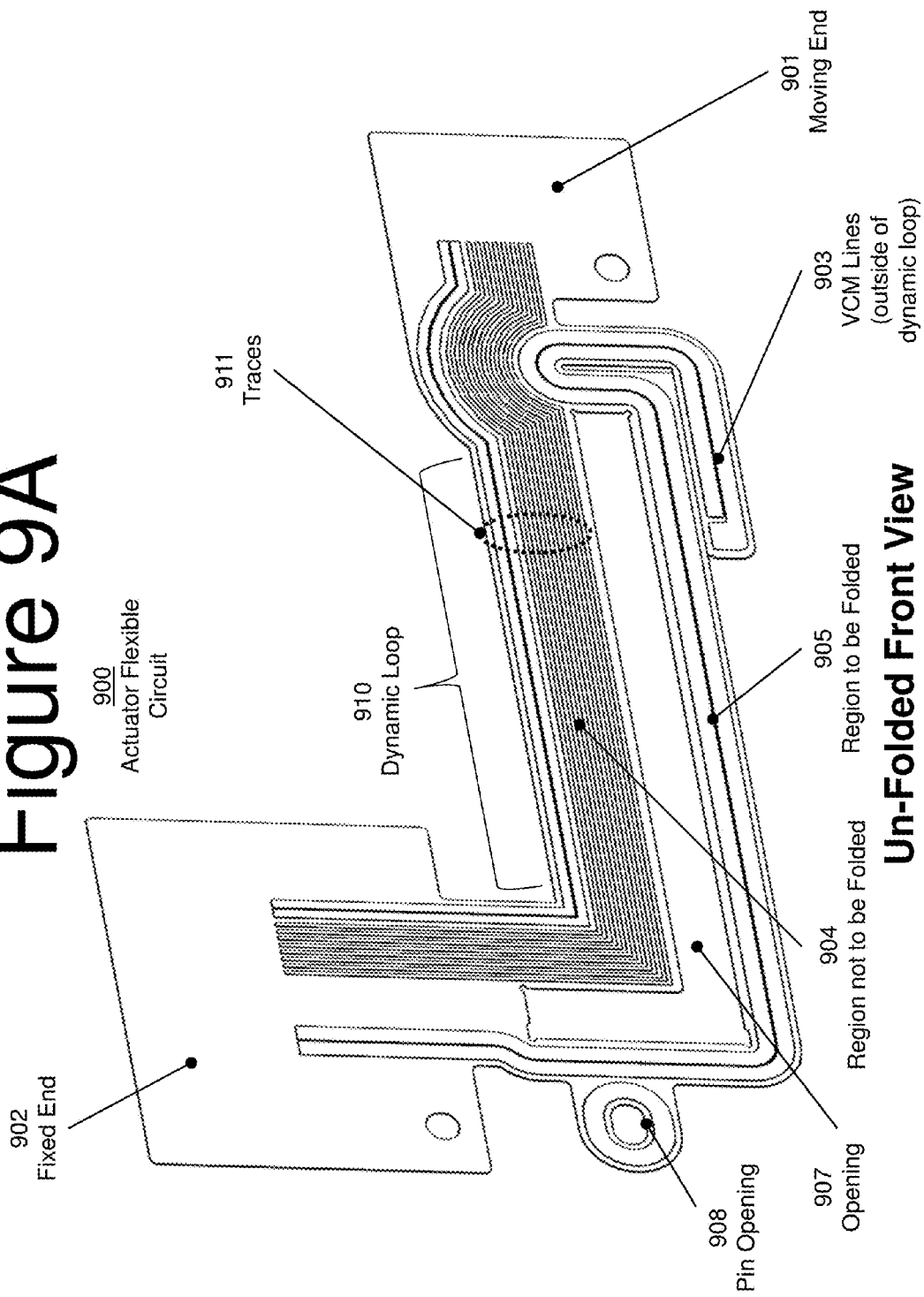

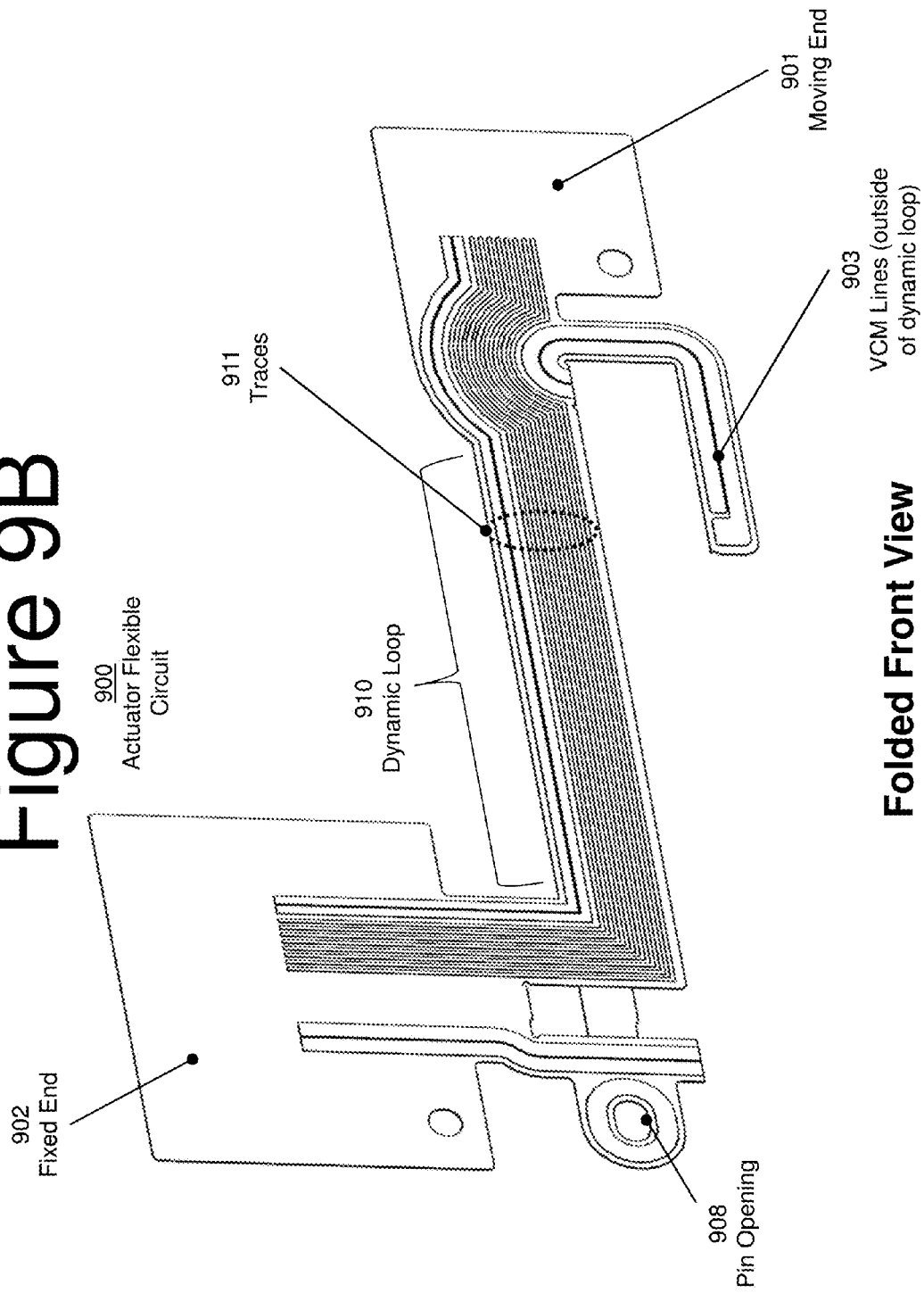

Folded Front View

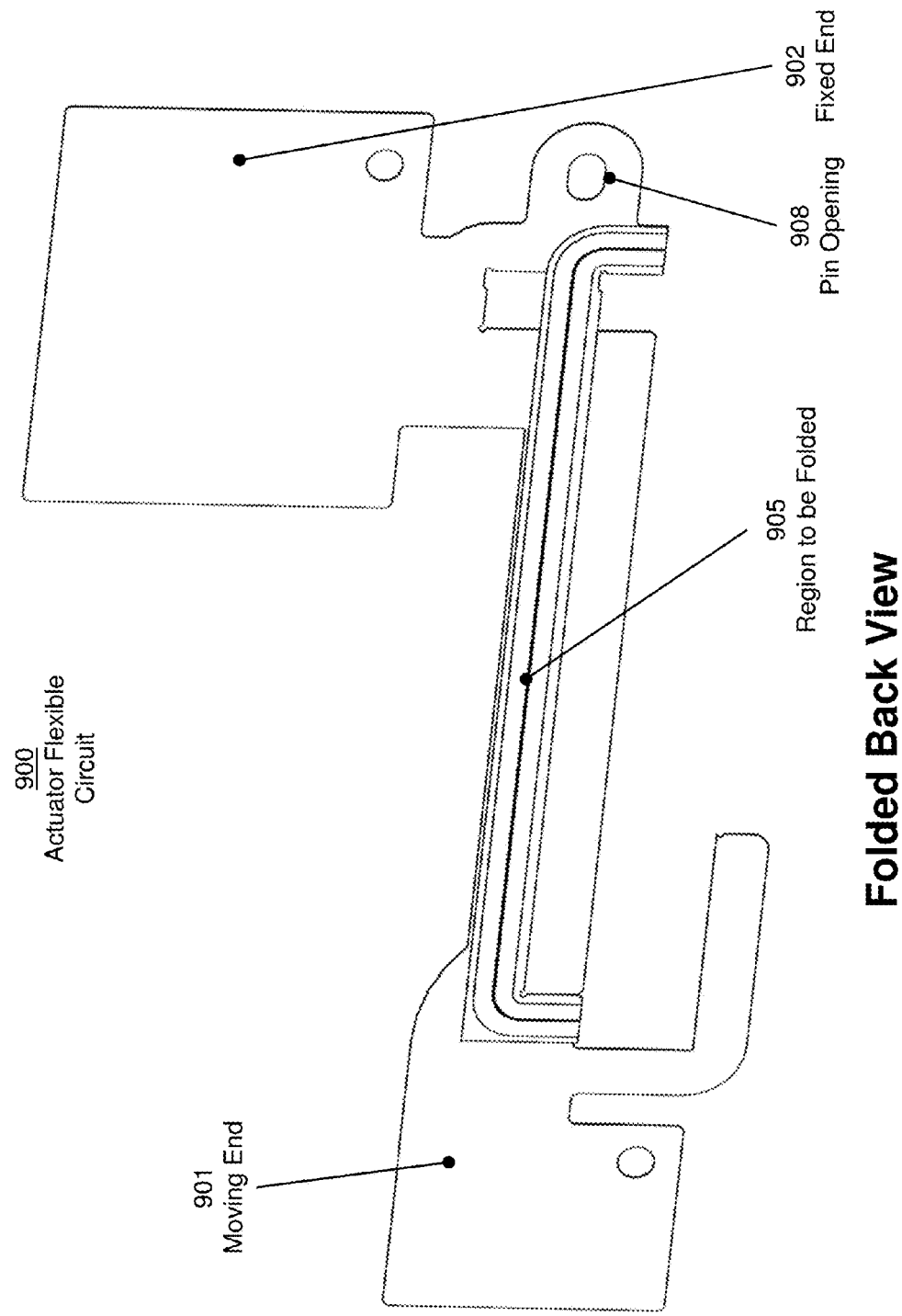

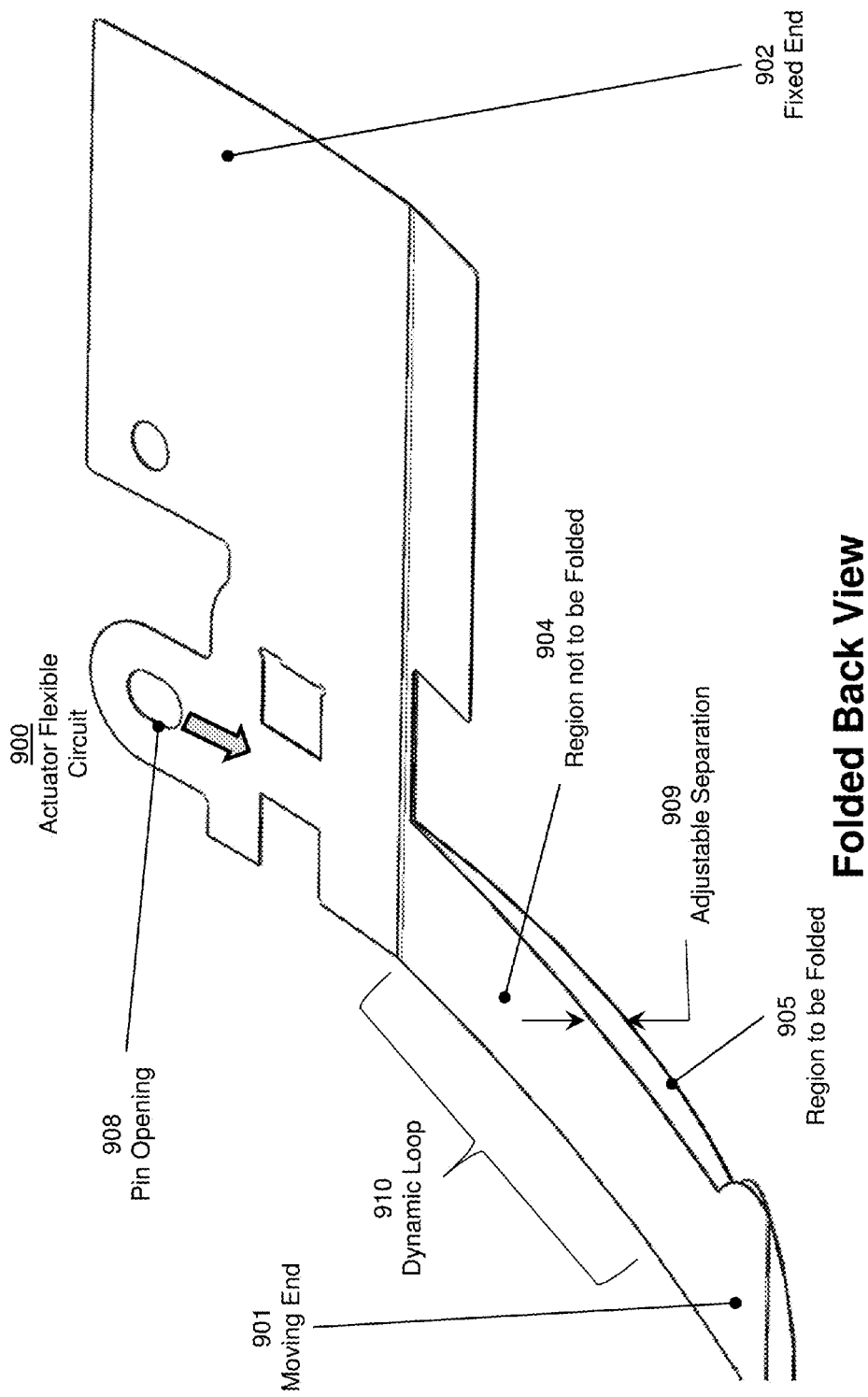

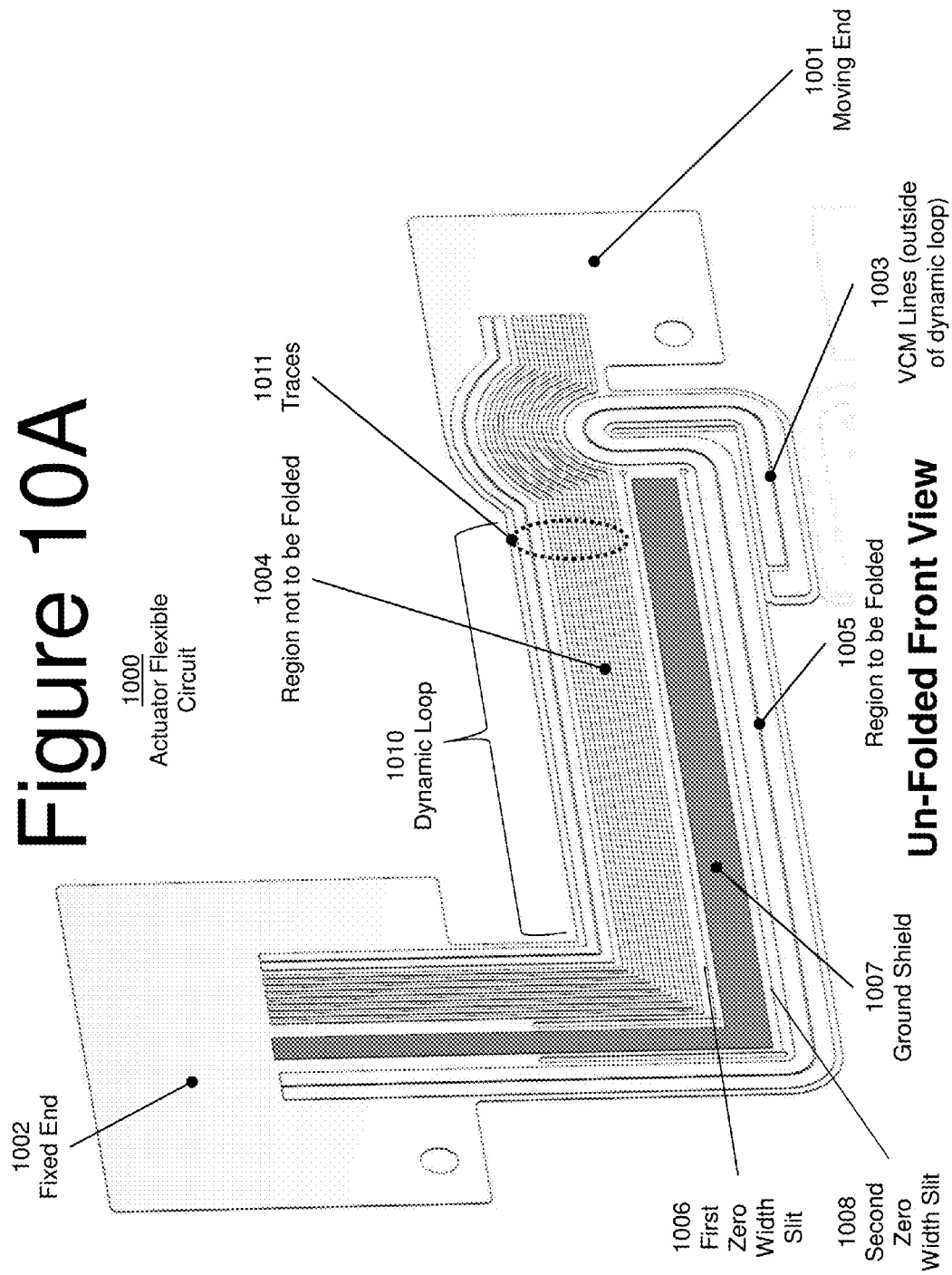

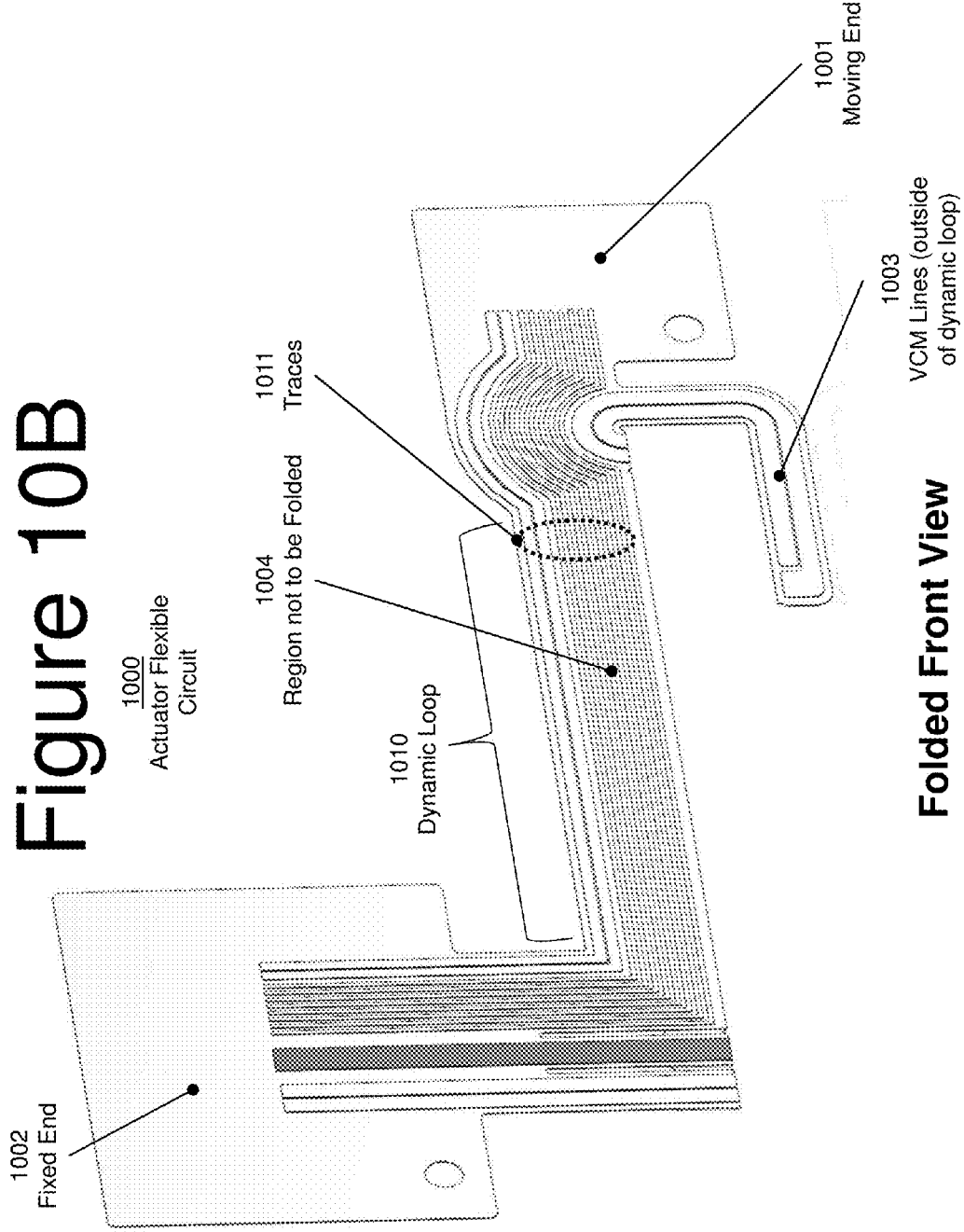

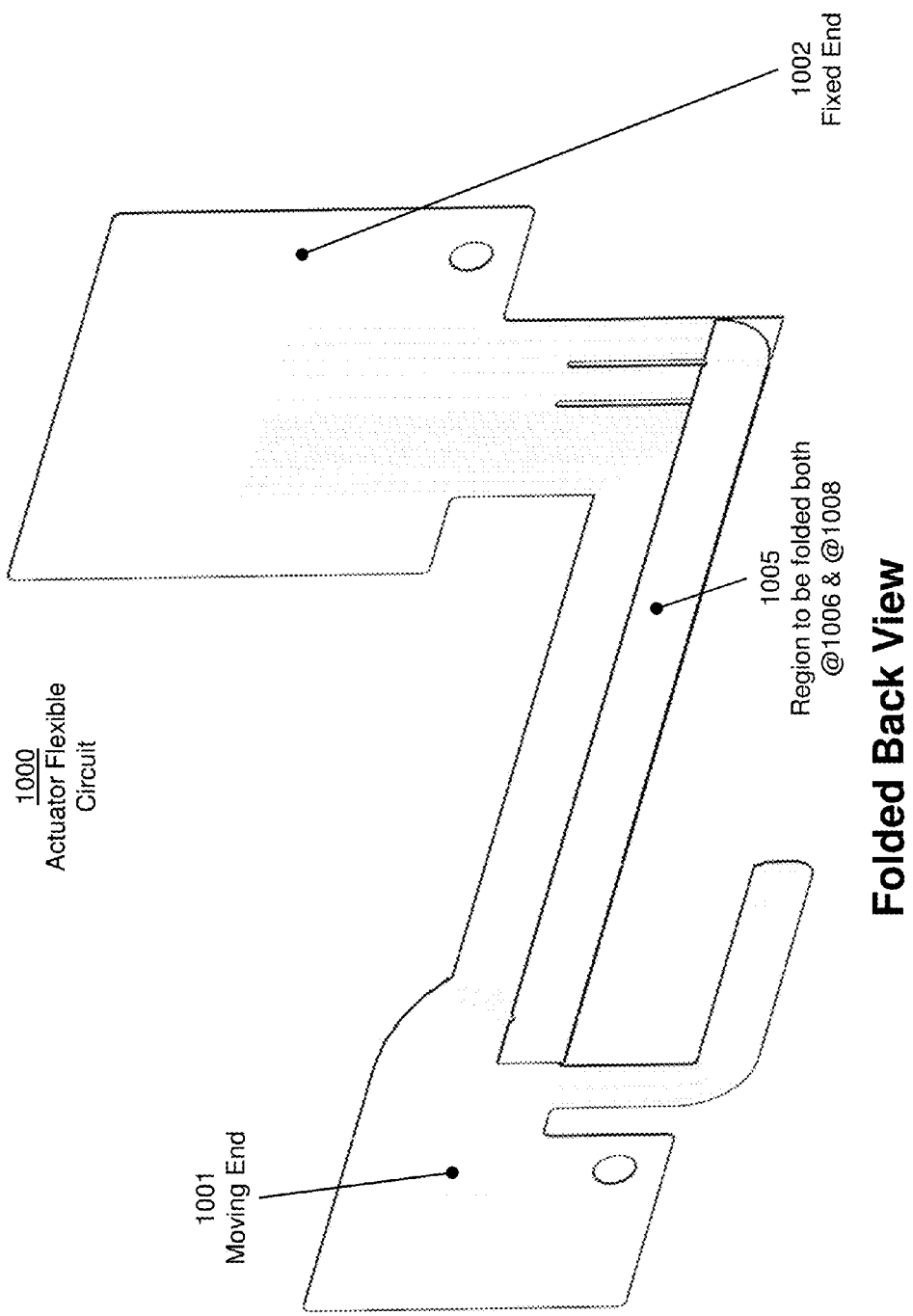

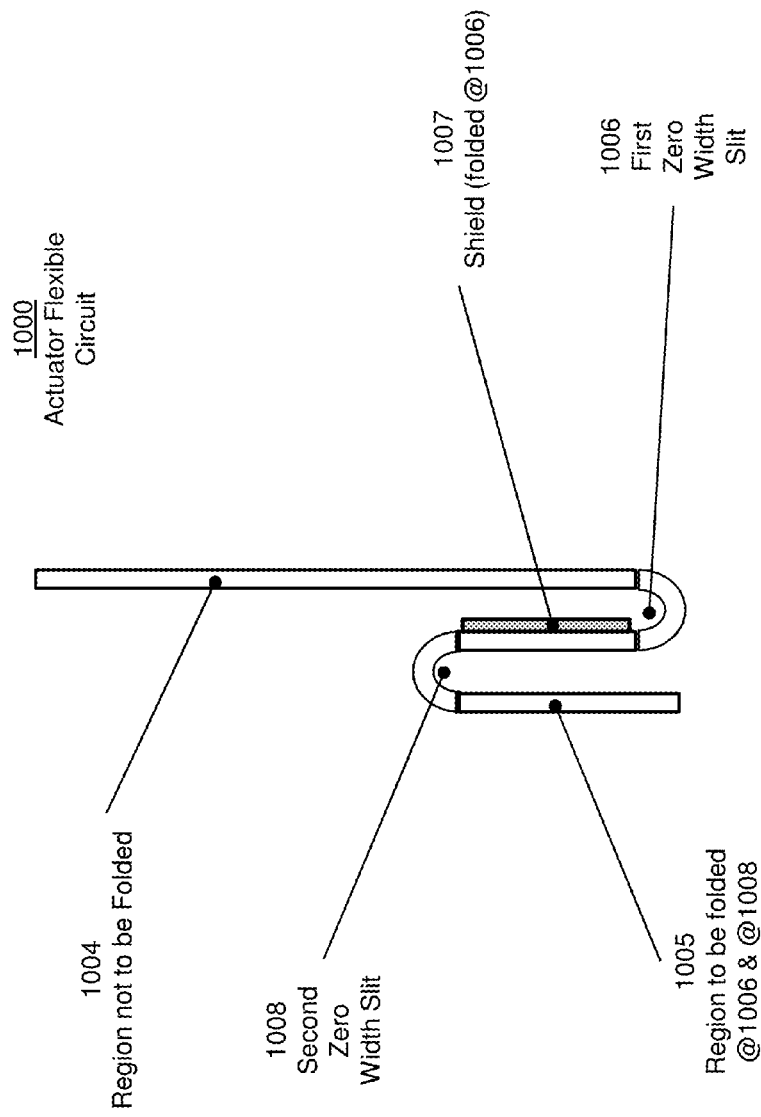

DYNAMIC LOOP WITH FOLD

CROSS-REFERENCE TO RELATED APPLICATION

This application claims priority from U.S. Provisional Application No. 61/651,932, filed on May 25, 2012 in the United States Patent and Trademark Office, the disclosure of which is incorporated herein by reference in its entirety.

BACKGROUND

1. Field

Apparatuses consistent with the exemplary embodiments relate to hard disk drive (HDD) technology, and more specifically, to an HDD actuator flexible circuit.

2. Related Art

FIG. 1 illustrates an HDD with a dynamic loop 110. HDDs in the related art may utilize a flexible circuit connecting the heads 107 on an actuator arm 104 to the printed circuit board (PCB) 103. The flexible circuit moves freely and dynamically as the actuator arm moves between inner and outer data cylinders on the disk platter. The flexible circuit serves to facilitate instructions and functions between the PCB and the actuator arm voice coil motor (VCM) 105, preamplifier 106, and heads 107. The dynamic loop 110 is the portion of the HDD actuator flexible circuit routed from the PCB fixed end 102, also called a connector, to the moving end 101 and the actuator arm 104. Traces are routed onto a flexible material so that when the actuator arm moves while performing functions with the hard disk drive platter (e.g. read, write, seek), the dynamic loop 110 may flexibly move along with the actuator arm while maintaining a connection between the PCB 103 and the actuator arm 104 and heads 107. The dynamic loop may be arranged as a single layer circuit or a dual layer circuit.

FIGS. 2A and 2B illustrate cross sections of a single layer dynamic loop and a dual layer dynamic loop, respectively.

In the related art implementations of the single layer dynamic loop, the traces are routed on one side of a flexible material. The single layer circuit may contain a cover polyimide, a cover adhesive, a trace layer which may contain copper traces, and a base polyimide. However, as HDDs become progressively smaller, width and spacing limitations may cause the single layer dynamic loop to consume proportionally more space within the HDD than is desired. To ensure sufficient electrical connectivity between the actuator arm and the PCB, the single layer circuit may have trace width and spacing requirements depending on the design of the HDD. If extra traces are needed between the PCB and the actuator arm to accommodate added functionality, for example dual heaters, dual writers, and laser heat assist writing, the single layer dynamic loop may require more space within the HDD.

A dual layer dynamic loop could be employed to increase the number of traces routed through the dynamic zone while saving space within the HDD. In a dual layer circuit implementation, two layers of traces are routed on the top and the bottom of the flexible material of the dynamic loop. A dual layer dynamic loop may contain a base polyimide, a layer of traces on each side of the polyimide which may contain copper traces, a cover adhesive on each trace layer and a cover polyimide on each cover adhesive layer.

However, the dual layer dynamic loop suffers from additional copper trace stress in comparison to the single layer dynamic loop. As the actuator arm moves while performing functions of the hard disk drive, the dual layer dynamic loop undergoes stress on the top traces and the bottom traces, which may be about twice that of a single layer dynamic loop.

FIGS. 3A and 3B illustrate a stress comparison chart between a single layer dynamic loop and dual layer dynamic loop, for the example configurations in FIGS. 2A and 2B. As shown in FIGS. 3A and 3B, the dual layer dynamic loop configurations undergo roughly twice the amount of peak stresses as the single layer dynamic loop. From FIG. 2A (single layer), six traces have designated names for stress on the top and the bottom, for example, 3t is the maximum stress at the top side of trace number 3. FIG. 2B shows a similar naming convention for a dual layer configuration, and three added traces on the lower Cu level are shown for illustration purposes. FIG. 3A then illustrates the stresses at each position, and for both single and dual layer. FIG. 3B shows the averaged, maximum stresses for overall, top, and bottom trace locations. Due to the greater number of traces running through the dual layer dynamic loop and more so, their geometric distance from the neutral axis, the resulting stiffness of the dual layer dynamic loop configuration is on the order of five times that of the single layer dynamic loop. The table at upper right of FIG. 3B shows simulated values of this. Though the two trace layers of the dual layer dynamic loop can be routed as needed within the HDD, the aforementioned 2× the stress and 5× the stiffness are prohibitive.

Increased functionality of the HDD actuator flexible circuit requires a greater number of traces within the dynamic loop. The increased number of traces may widen the loop and increase stiffness. Therefore, there is a need to route a larger number of traces without sacrificing trace width and spacing while keeping stiffness low and addressing the above-noted stress penalty of dual layer dynamic loops.

SUMMARY

An aspect of an exemplary embodiment is directed to a single layer dynamic loop, including a set of traces divided by a slit on the single layer dynamic loop, wherein the set of traces are divided into a first region and a second region; and wherein the single layer dynamic loop is folded along the slit to move at least part of the first region in relation to the second region.

Another exemplary embodiment is directed to a single layer dynamic loop, including a set of traces; voice coil motor lines; and an opening located below the set of traces and located above the voice coil motor lines; wherein the single layer dynamic loop is folded along the opening to move at least a first region of the dynamic loop in relation to a second region of the dynamic loop.

Another exemplary embodiment is directed to a single layer dynamic loop, including a set of traces; voice coil motor (VCM) lines; a first slit located below the traces; and a second slit located above the VCM lines; wherein the single layer dynamic loop is first folded along the first slit and the single layer dynamic loop is second folded along the second slit.

BRIEF DESCRIPTION OF THE DRAWINGS

The above and/or other aspects will become apparent and more readily appreciated from the following description of the exemplary embodiments, taken in conjunction with the accompanying drawings, in which:

FIG. 1 illustrates a hard disk drive (HDD) with a dynamic loop;

FIGS. 2A and 2B illustrate cross sections of a single layer dynamic loop and the dual layer dynamic loop, respectively;

FIG. 4A illustrates an un-folded front view of a single layer dynamic loop with a slit in the circuit, and FIG. 4B illustrates a folded front view of a fold of the single layer dynamic loop with the slit in the circuit in accordance with exemplary embodiments;

FIG. 5A illustrates an unfolded front view of a single layer dynamic loop with an a slit for permitting fold, FIG. 5B illustrates an unfolded front view of the single layer dynamic loop with a slit and spacers, adhesive patches, or dampers for permitting a fold, FIG. 5C illustrates a folded front view of FIG. 5B, and FIG. 5D illustrates a folded back view of FIG. 5B in accordance with exemplary embodiments;

FIG. 6A illustrates an un-folded front view of a single layer dynamic loop with a slit for permitting a fold at an area above a VCM line region of the dynamicloop, FIG. 6B illustrates a folded front view of the single layer dynamic loop with the slit for permitting a fold at an area above the VCM line region of FIG. 6A, and FIG. 6C illustrates a folded back view of the single layer dynamic loop of FIG. 6A, in accordance with exemplary embodiments;

FIG. 7A illustrates an un-folded front view of a single layer dynamic loop with a slit for permitting a fold of the dynamic loop, FIG. 7D illustrates an un-folded front view of the single layer dynamic loop with a shield layer on the VCM line region of the dynamic loop, FIG. 7E illustrates a folded front view of the single layer dynamic loop with a shield layer on the VCM line region of the dynamic loop, and FIG. 7F illustrates a folded back view of the single layer dynamic loop with a shield layer on the VCM line region of the dynamic loop, in accordance with exemplary embodiments;

FIG. 8A illustrates an un-folded front view of a single layer dynamic loop with an opening for permitting a fold of the dynamic loop, FIG. 8B illustrates a folded front view of the single layer dynamic loop with the opening for permitting a fold of the dynamic loop of FIG. 8A, and FIG. 8C illustrates a folded back view of the single layer dynamic loop with the opening for permitting a fold of the dynamic loop of FIG. 8A, in accordance with exemplary embodiments;

FIG. 9A illustrates an un-folded front view of a single layer dynamic loop with a pin opening for permitting a fold of the dynamic loop, FIG. 9B illustrates a folded front view of the single layer dynamic loop with the pin opening for permitting a fold of the dynamic loop of FIG. 9A, FIG. 9D illustrates a folded back view of the single layer dynamic loop with the pin opening for permitting a fold of the dynamic loop of FIG. 9A, and FIG. 9E shows a folded back isometric view of the single layer dynamic loop of FIG. 9A, with an adjusted layer separation, in accordance with exemplary embodiments;

FIG. 10A illustrates an un-folded front view of a single layer dynamic loop with two slits for permitting multiple folds of the dynamic loop, FIG. 10B illustrates a folded front view of the single layer dynamic loop with the two slits for permitting multiple folds of the dynamic loop, FIG. 10C illustrates a folded back view of the single layer dynamic loop with the two slits for permitting multiple folds of the dynamic loop, and FIG. 10D illustrates a folded side view of the single layer dynamic loop with the two slits for permitting multiple folds of the dynamic loop, in accordance with exemplary embodiments.

DETAILED DESCRIPTION OF EXEMPLARY EMBODIMENTS

In the following detailed description, reference will be made to the accompanying drawing(s), in which identical functional elements are designated with like numerals. The aforementioned accompanying drawings show by way of illustration, and not by way of limitation, exemplary embodiments and exemplary implementations utilizing principles of the exemplary embodiments. These implementations are described in sufficient detail to enable those skilled in the art to practice the exemplary embodiments and it is to be understood that other implementations may be utilized and that structural changes and/or substitutions of various elements may be made without departing from the scope and spirit of exemplary embodiments. The following detailed description is, therefore, not to be construed in a limited sense.

Exemplary embodiments are directed to a single layer dynamic loop folded onto itself, which allows a greater number of traces to be routed on a single layer flexible circuit. In an exemplary embodiment, the fold may result in two individual loops separated by an air gap. By folding a single layer dynamic loop onto itself, the exemplary embodiments allow a greater number of circuits routed through the dynamic loop while keeping stiffness lower than a comparable dual layer dynamic loop. In an exemplary embodiment, the single layer dynamic loop is formed by splitting up the circuitry between two parallel polyimide "ribbons" separated by a slit or cut, and then folding the loops back to back to create two separate loops. If desired, also introduced in this disclosure are folded loops having differing widths and differing lengths. The slit, cut or opening can be made by, for example, blade punching, die punching, etching, photo imaging, or laser, however, it is not limited to these exemplary methods.

Figure 3A:
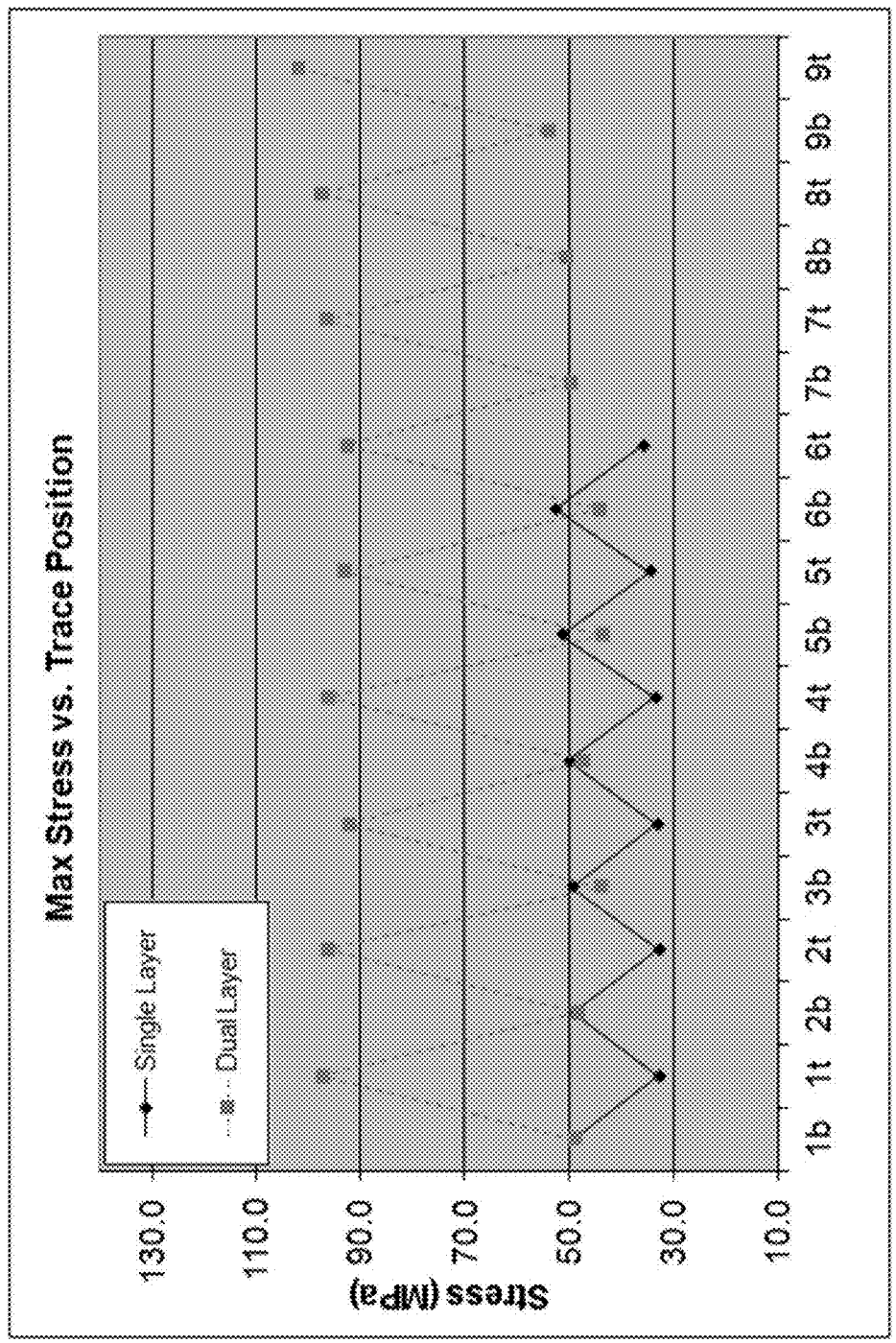
FIG. 3A illustrates a stress comparison chart between a single and dual layer dynamic loop, at each trace position corresponding to naming conventions in FIGS. 2A and 2B, and FIG. 3B further summarizes this stress comparison, with overall average, and averages at the top and the bottom of copper traces.
Figure 3B:
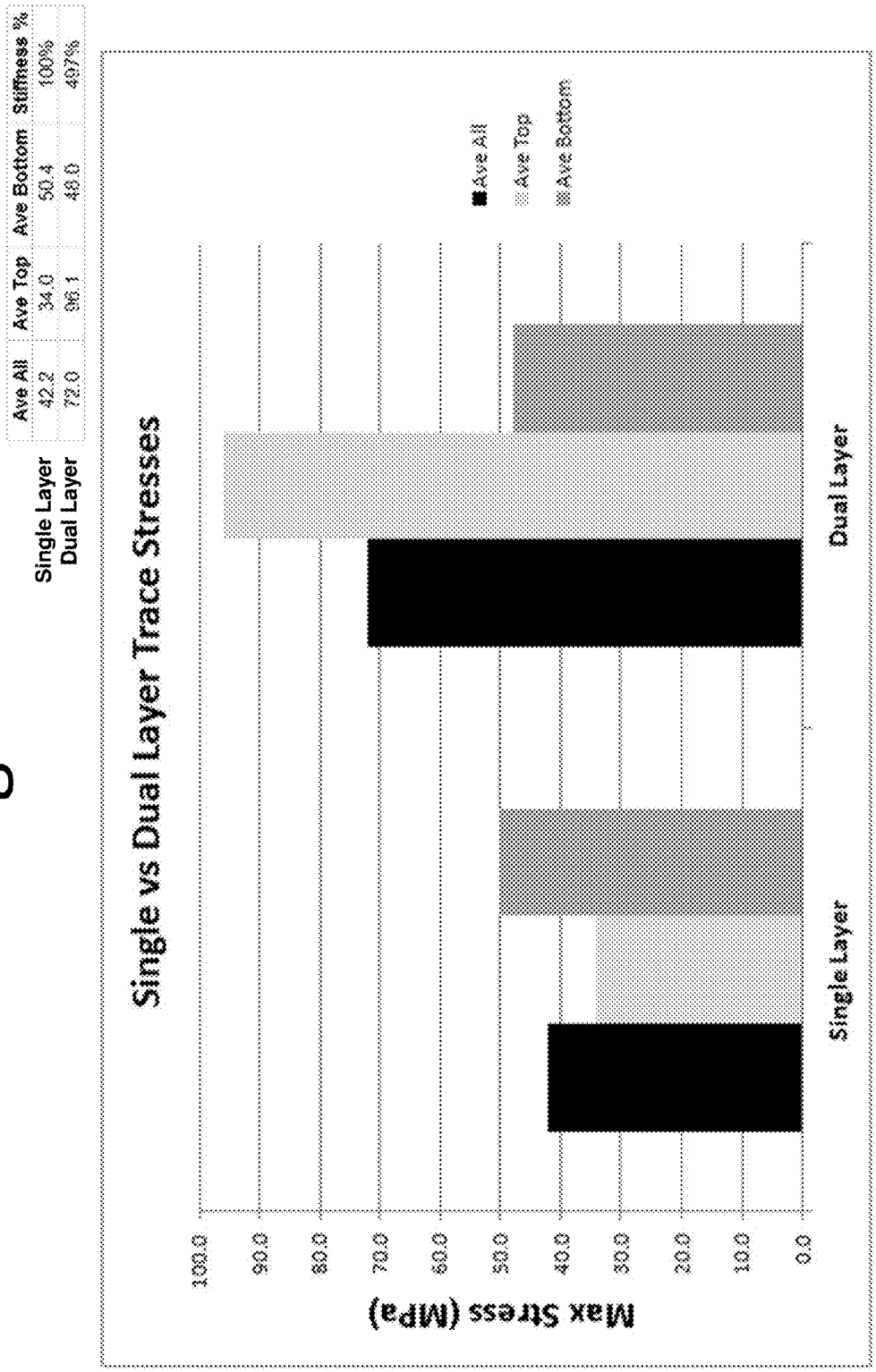

Because the folded layers are not united, the folded single layer dynamic loop has reduced stress in comparison to the dual layer dynamic loop. In an exemplary embodiment, the folded layers are separated by a thin air gap. The folded single layer dynamic loop behaves similarly to having two unfolded single layer dynamic loops, with similar stress, reliability and stiffness characteristics. However, the folded single layer dynamic loop will take up less vertical space within the HDD in comparison to the utilization of wider single layer loops without folding, all else being equal. Folding of a circuit is beneficial over adding a separate single layer circuit, because interconnecting each trace in a separate circuit would be necessary. The exemplary embodiments construct a single layer circuit that both fits into the thin vertical design space, and does not adopt a dual layer copper trace which has 2× the stress and 5× the stiffness penalties (FIG. 3B).

FIG. 4A illustrates an un-folded front view of a single layer dynamic loop with a slit in the circuit, in accordance with an exemplary embodiment. As shown in FIG. 4A, an actuator flexible circuit 400 of a hard disk drive (HDD) includes a dynamic loop 410, traces 411 of the dynamic loop, a fixed end or connector end 402, a zero width slit 406, VCM lines outside of the dynamic loop 403 and a moving end or head end 401.

The single layer dynamic loop 410 can include a base polyimide layer, a copper layer, a cover adhesive layer and a cover polyimide layer.

The dynamic loop 410 includes a region not to be folded 404 and a region to be folded 405. The region to be folded 405 and the region not to be folded 404 can vary as indicated in the exemplary embodiments. For example, the region to be folded 405 and the region not to be folded 404 can depend upon a size of an opening or slit or the design and shape of the dynamic loop. A zero width slit 406 is shown in FIG. 4A, however, a slit of varying sizes can be used, such as a thin width slit. The zero width slit does not have a width and can be made by, for example, a blade. However, the zero width slit is not limited to this exemplary method. Further, in a zero width slit, no portion of the material is removed. A thin width slit can have a portion of the material removed. The slits can be made using a die or laser. A thin width slit can also be created by punching out a portion of the material.

FIG. 4B illustrates a folded front view of a fold of the single layer dynamic loop with the slit in the circuit in accordance with an exemplary embodiment. FIG. 4B illustrates a center fold since the dynamic loop 410 is folded in the center of a longitudinal direction of the dynamic loop, thereby folding the dynamic loop 410 equally in half. Although a centered fold is illustrated, the fold could be placed in various positions. As shown in FIG. 4B, the traces 411 of the single layer dynamic loop 410 are folded along the center line of a longitudinal direction of the dynamic loop to at least partially dispose one set of the traces divided by the zero width slit 406 behind another set of traces. Although a zero width slit is shown in FIGS. 4A and 4B, the size and shape of the slit can be modified. Further, an opening can also be used instead of a slit. Also, a fold can be performed on a dynamic loop without a slit or opening.

The trace layer of the single layer dynamic loop is divided by the zero width slit 406 along a center line of the single layer dynamic loop, into a first set of traces called a region not to be folded 404 and a second set of traces called a region to be folded 405. The two sets of traces can be conceptually viewed as two "cables" for each set of traces. The zero width slit 406 separates the two cables along the baseline to allow for a fold. The zero width slit 406 may also divide the traces to form two "cables" of similar width. Cables of same width or differing width are possible. A portion of one cable is then folded over and behind the second cable.

A larger open area may be provided to exclude the VCM traces from the folding operation, which may be necessary for routing purposes. The fold may be conducted in various ways. One way is to have the exterior portion cover polyimide surface, mate with the interior portion cover polyimide surface. Alternatively, the fold may be conducted to have the exterior portion base layer surface, mate with the interior portion base layer surface. Therefore, the folding can be cover to cover or base to base. Additional slits can be formed near the fixed end or connector end 402 to allow for more complex folds. Therefore, by folding the dynamic loop 411 in half as shown in FIG. 4A, the height of the dynamic loop in the HDD is decreased.

FIG. 5A illustrates an unfolded front view of a single layer dynamic loop with a slit for permitting a fold at the connector end, in accordance with an exemplary embodiment. FIG. 5A is a simplified view of the circuit shown in FIG. 4A. The actuator flexible circuit 500 of a hard disk drive (HDD) includes a dynamic loop 510, traces 511 of the dynamic loop, a fixed end or connector end 502, a zero width slit 506, VCM lines outside of the dynamic loop 503 and a moving end or head end 501. The dynamic loop 510 includes a region not to be folded 504 and a region to be folded 505.

FIG. 5B illustrates an unfolded front view of the single layer dynamic loop of FIG. 5A with spacers, adhesive patches, or dampers called added volumes 509. As shown in FIG. 5B, the spacers, adhesive patches, or dampers 509 are positioned towards the ends of the dynamic loop 510, however, the spacers, adhesive patches, or dampers 509 can be positioned anywhere on the dynamic loop 510, or beyond it.

A spacer prevents the folded sides, or cables, of the dynamic loop 510 from contacting after the dynamic loop 510 is folded. Spacers can be added to keep the circuits of a folded dynamic loop separate. Stress distribution and loop shape behavior of the copper traces will depend on the mechanical coupling of unfolded and folded layers, so the spacer size and placement can be modified as necessary. Localized stiffness changes in the loop could also be realized with the spacer approach, especially for detailed loop shaping to minimize stresses at connector and head ends. Although two added volumes are shown in FIG. 5B, the number and placement of the spacers are not limited to any particular configuration.

An adhesive patch connects the folded layers of the dynamic loop 510 together. Adhesive patches may be added to connect cables to each other to maintain the cables at a set position or space relative to each other. The number and placement of the adhesive patches are not limited to any particular configuration.

A damper absorbs energy so that vibration of the hard disk drive is absorbed and vibration can be kept quiet between the folded layers of the dynamic loop 510. Damping material may be added between cables and may serve to absorb energy in the cables in the dynamic sense. Dampers may be made, for example with a viscoelastic layer, in a dual constrained layer configuration, to prevent unwanted vibrations within the dynamic loop. The number and placement of the dampers are not limited to any particular configuration. A damper, spacer, or adhesive patch can be used in any of the exemplary embodiments.

FIG. 5C illustrates a folded front view of FIG. 5B, in accordance with an exemplary embodiment. FIG. 5D illustrates a folded back view of FIG. 5B. As shown in FIG. 5C the added volumes 509, for example, an adhesive, is added so the sides of the dynamic loop are folded over and adhere together. Therefore, the sides of the dynamic loop (region to be folded 505 and region not to be folded 504) are prevented from separating. Further, the added volumes 509 maintain a space between the two portions (region to be folded 505 and region not to be folded 504) of the dynamic loop which prevents or eliminates contact or creates contact in selected areas, as desired.

FIG. 6A illustrates an un-folded front view of a single layer dynamic loop with a slit for permitting a fold at an area above a voice coil motor(VCM) line region of the dynamic loop, in accordance with an exemplary embodiment. The actuator flexible circuit 600 of a hard disk drive (HDD) includes a dynamic loop 610, traces 611 of the dynamic loop, a fixed end or connector end 602, a zero width slit 606, VCM lines outside of the dynamic loop 603 and a moving end or head end 601. The dynamic loop 610 includes a region not to be folded 604 and a region to be folded 605.

Therefore, as shown in FIGS. 6A, 6B, 6C, a fold can be performed at a region above VCM lines of the dynamic loop instead of in a center longitudinal line of the dynamic loop as shown in FIGS. 4A, 4B and 4C.

In addition to the thin width slits or zero width slits for folding along the center line, a large open area can be included near the fixed end or head end 602, to allow for fold isolation as needed.

FIG. 6B illustrates a folded front view of the single layer dynamic loop with the slit for permitting a fold at an area above the VCM line region of the dynamic loop 610, in accordance with an exemplary embodiment. FIG. 6C illustrates a folded back view of the single layer dynamic loop 610 folded at an area above the VCM lines region to be folded 605, in accordance with an exemplary embodiment. VCM lines are connected to a coil and drive an actuator arm back and forth. The dynamic loop 610 is folded at an area above the VCM line region 605 of the dynamic loop 610 since the VCM lines contain high current. By folding the dynamic loop 610 at a region above the VCM lines region to be folded 605, the shape of the dynamic loop can be adjusted and modified. Specifically, as shown in FIG. 6C, the size of the region which is folded is not the same as the size of the region which is not folded, thereby creating an alternative size and shape for the dynamic loop 610.

FIG. 7A illustrates an un-folded front view of a single layer dynamic loop with a slit for permitting a fold, in accordance with an exemplary embodiment. The actuator flexible circuit 700 of a hard disk drive (HDD) includes a dynamic loop 710, traces 711 of the dynamic loop, a fixed end or connector end 702, a zero width slit 706, VCM lines outside of the dynamic loop 703 and a moving end or head end 701. The dynamic loop 710 includes a region not to be folded 704 and a region to be folded 705.

Figure 7B:
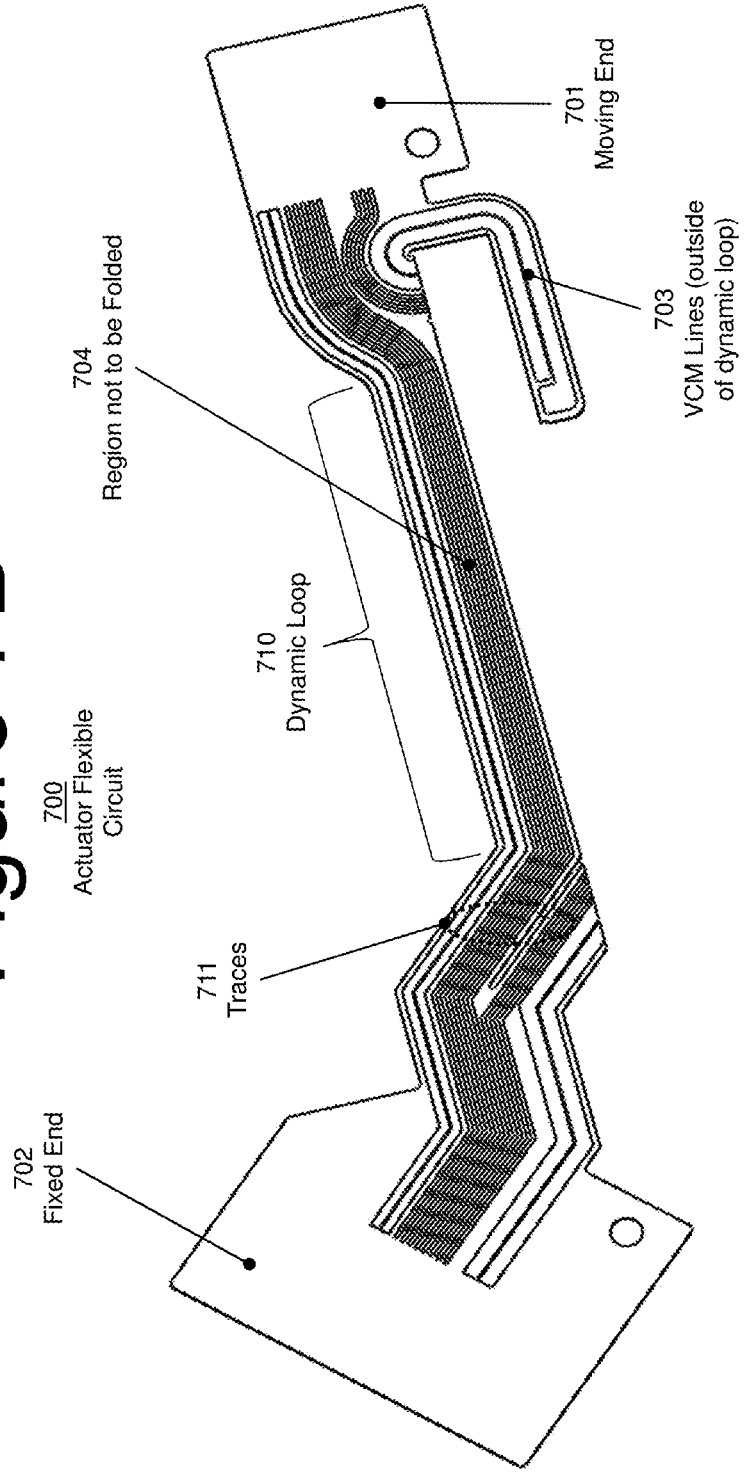
FIG. 7B illustrates a folded front view of the single layer dynamic loop with a slit for permitting a fold.
Figure 7C:
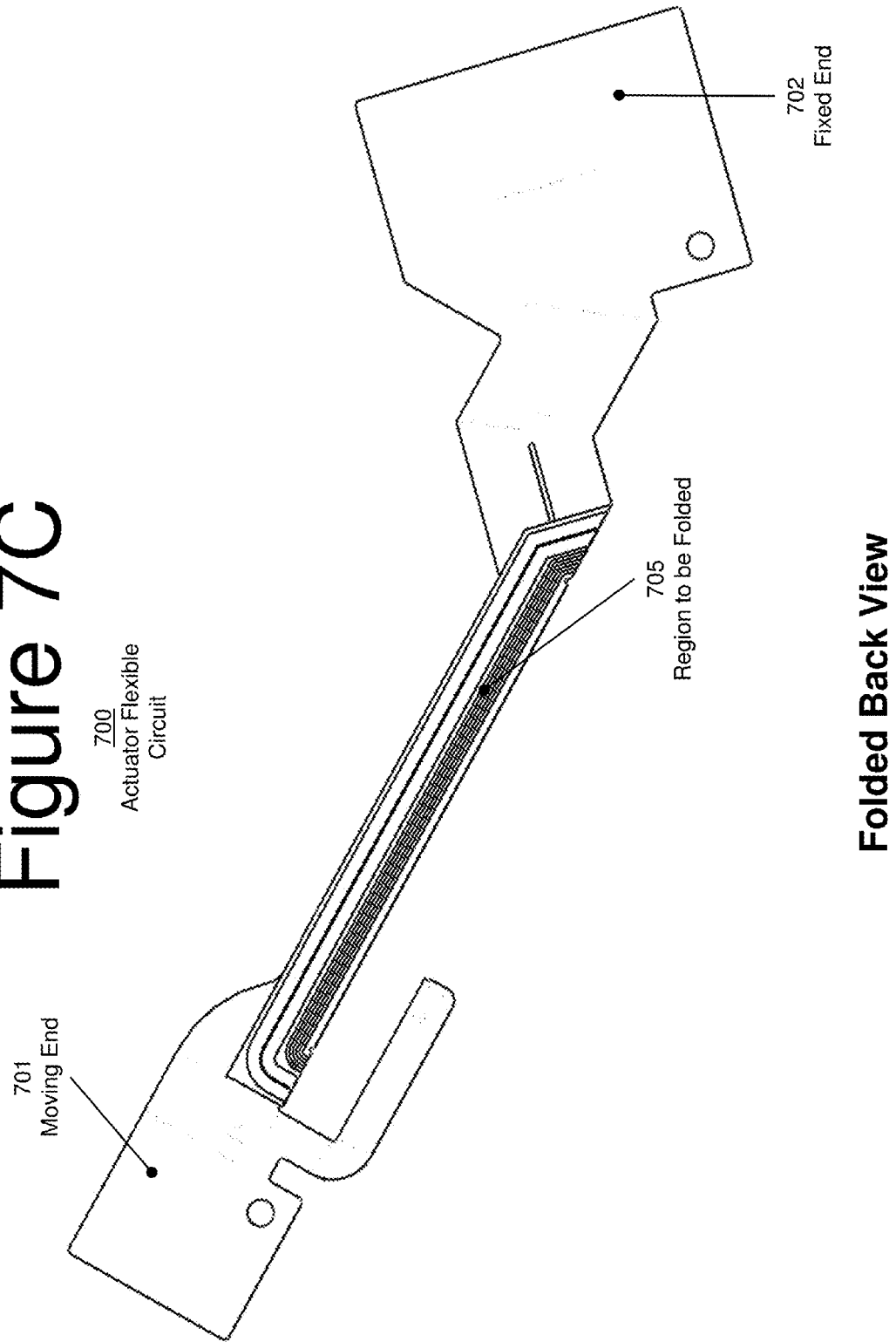
FIG. 7C illustrates a folded back view of the single layer dynamic loop with a slit for permitting a fold of FIG. 7A.

FIG. 7B illustrates a folded front view of the single layer dynamic loop with a slit for permitting a fold at location of zero width slit 706 of FIG. 7A, in accordance with an exemplary embodiment. FIG. 7C illustrates a folded back view of the single layer dynamic loop of FIG. 7A, in accordance with an exemplary embodiment.

FIG. 7D illustrates an un-folded front view of the single layer dynamic loop with a shield layer on the VCM lines region of the dynamic loop, in accordance with an exemplary embodiment. FIG. 7E illustrates a folded front view of the single layer dynamic loop with a shield layer on the VCM lines region to be folded 705 of the dynamic loop, in accordance with an exemplary embodiment. FIG. 7F illustrates a folded back view of the single layer dynamic loop with a shield layer on the VCM lines region to be folded 705 of the dynamic loop, in accordance with an exemplary embodiment. The shield layer 707 covers the VCM lines on the dynamic loop 710, and beyond as shown in FIG. 7D.

Although a shield or shield layer in shown with respect to FIG. 7D, a shield or shield layer can be used in any of the exemplary embodiments. The shield or shield layer can be made of any number of materials. For example, the shield or shield layer can be made of paste, tape, or copper, but the exemplary embodiments are not limited to these materials. By covering the VCM lines with the shield or shield layer, the other traces 711 of dynamic loop 710 are protected from noise and noise isolation can be performed. As opposed to FIGS. 4B and 6C, the fold in FIG. 7E is made towards the viewer. Therefore, the shield 707 provides electrical isolation of the region to be folded 705 from the region not to be folded 704.

FIG. 8A illustrates an un-folded front view of a single layer dynamic loop with an opening for permitting a fold of the dynamic loop, in accordance with an exemplary embodiment. The actuator flexible circuit 800 of a hard disk drive (HDD) includes a dynamic loop 810, traces 811 of the dynamic loop, a fixed end or connector end 802, an opening 807, VCM lines outside of the dynamic loop 603 and a moving end or head end 801. The dynamic loop 810 includes a region not to be folded 804 and a region to be folded 805.

FIG. 8B illustrates a folded front view of the single layer dynamic loop at the opening 807. FIG. 8C illustrates a folded back view of the single layer dynamic loop at the opening 807.

As opposed to FIG. 4A which uses a zero width slit 406 for the fold, an opening 807 is used for the fold in the exemplary embodiment of FIG. 8A. The opening 807 as shown in FIG. 8A is a large opening which runs along the longitudinal length of the dynamic loop 810. By using a large open area near, for example, the head end or moving end, electrical isolation can be provided as needed, for example, for VCM trace interactions with specific other traces 811. The variable width fold of the dynamic loop can provide a pair of cables (regions to be folded 805 and region not to be folded 804) of unequal length. By using the opening 807 instead of, for example, a thin width slit or a zero width user, there is greater freedom of movement for positioning the fold. Further, by using an opening 807 the positioning of the VCM lines can be more greatly adjusted.

FIG. 9A illustrates an un-folded front view of a single layer dynamic loop with a pin opening for permitting a fold of the dynamic loop, in accordance with an exemplary embodiment. The actuator flexible circuit 900 of a hard disk drive (HDD) includes a dynamic loop 910, traces 911 of the dynamic loop, a fixed end or connector end 902, an opening 907, VCM lines outside of the dynamic loop 903, a pin opening 908, and a moving end or head end 901. The dynamic loop 910 includes a region not to be folded 904 and a region to be folded 905.

Figure 9C:
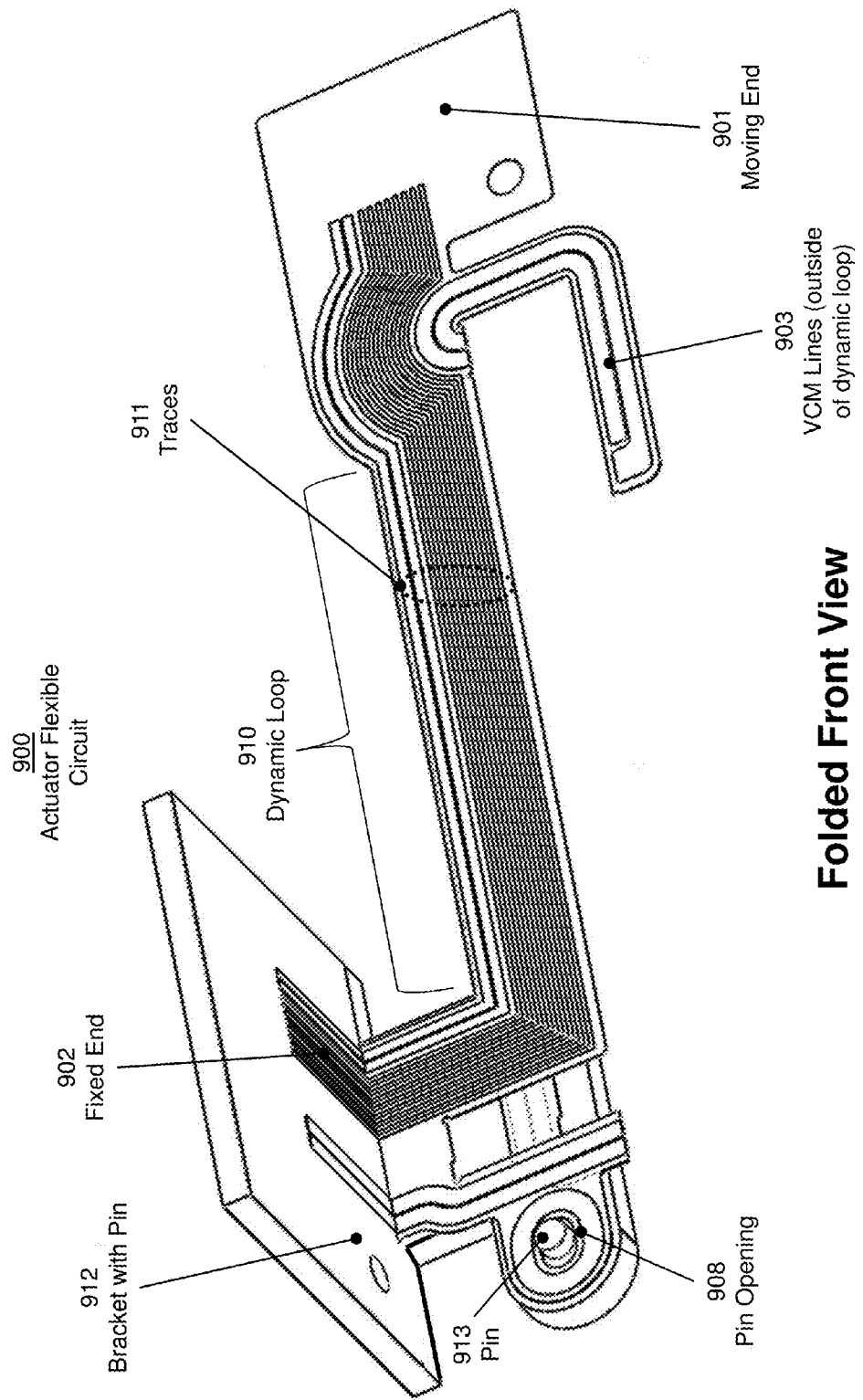
FIG. 9C illustrates a bracket with pin method of adjusting a pin opening.

FIG. 9B illustrates a folded front view of the single layer dynamic loop of FIG. 9A, having a pin opening 908, and fold opening 907 for permitting a fold of the dynamic loop. The pin opening or hole 908 is attached to VCM lines. The pin opening 908 shown in FIGS. 9A and 9B can be pulled or pushed in order to change the position or shape, or effective length of the lower VCM lines. For example, referring to FIG. 9C, the pin opening 908 can be adjusted using a pin 913, assembled into a bracket with pin 912, to adjust the length of the cable (e.g. region to be folded 905) in accordance with an exemplary embodiment. The cable (e.g. region to be folded 905) is the only member affected by the construction, or dimensions, of the bracket with pin 912. The portion of the cable (e.g. region to be folded 905) can be either elongated or shortened. By connecting the region to be folded 905 with the pin opening 908, the size and shape of the dynamic loop 910 can be adjusted. Specifically, this allows for the adjustment of the length of the single layer dynamic loop, depending on various implementations (e.g. folded cable in contact, not in contact, partial contact, etc.)

FIG. 9D illustrates a folded back view of the single layer dynamic loop 910 with the pin opening 908 in FIG. 9A, for permitting a fold of the dynamic loop at the opening 907. As shown in FIG. 9E, based on the amount of pushing and pulling on the pin 913 by the bracket with pin 912 in FIG. 9C, an adjustable separation 909 in FIG. 9E is created between the folded sections of the dynamic loop. The amount of separation between the cables or region not to be folded 904 and region to be folded 905 can therefore be adjusted.

FIG. 10A illustrates an un-folded front view of a single layer dynamic loop with two slits for permitting multiple folds or double folding of the dynamic loop, in accordance with an exemplary embodiment. The actuator flexible circuit 1000 of a hard disk drive (HDD) includes a dynamic loop 1010, traces 1011 of the dynamic loop, a fixed end or connector end 1002, a first zero width slit 1006, a second zero width slit 1008, a ground shield 1007, VCM lines outside of the dynamic loop 1003, and a moving end or head end 1001. The dynamic loop 1100 includes a region not to be folded 1004 and a region to be folded 1005.

The ground shield 1007 can be made on the same layer as the overall flexible circuit copper layer, therefore, the dynamic loop copper layer can be manufactured on a single side with the same process, yet resulting in a shield in between the layers when twice folded. The ground shield 1007 can be made of copper or other materials and is made at the same time as the traces 1011 of the actual flexible circuit 1000. Therefore, the ground shield 1007 can be made integral to the circuit itself, which can decrease costs.

FIG. 10B illustrates a folded front view of the single layer dynamic loop with a fold at a first zero width slit 1006 and another fold at second zero width slit 1008. FIG. 10C illustrates a folded back view of the single layer dynamic loop with the fold at the first zero width slit 1006 and another fold at second zero width slit 1008. FIG. 10D illustrates a folded side view of the single layer dynamic loop with the fold at the first zero width slit 1006 and another fold at second zero width slit 1008. In FIG. 10D, the fold radius and thickness of the shield layer are greatly exaggerated for illustration purposes.

Therefore, by using multiple folds, a double fold or accordion fold, three layers are separated by slits for folding, whereas the prior exemplary embodiments employ one fold line, so that only two layers are present in the final folded arrangement.

The exemplary embodiments minimize the area needed to route the large number of traces without sacrificing trace width and spacing, which may be needed for electrical performance, while keeping stiffness low by use of folds in a single layer dynamic loop.

Moreover, other implementations of the exemplary embodiments will be apparent to those skilled in the art from consideration of the specification and practice of the exemplary embodiments disclosed herein. Various aspects and/or components of the described embodiments may be used singly or in any combination. It is intended that the specification and examples be considered as exemplary only, with a true scope and spirit of the exemplary embodiments being indicated by the following claims.

What is claimed is:

1. A single layer dynamic loop, comprising:
   a set of traces divided by a slit on the single layer dynamic loop; and
   voice coil motor (VCM) lines,
   wherein the set of traces is divided into a first region and a second region,
   the single layer dynamic loop is folded along the slit to move at least part of the first region in relation to the second region, and
   the VCM lines are at least partially folded behind the second region.

2. The single layer dynamic loop of claim 1, wherein the single layer dynamic loop is folded along the slit to move at least part of the first region behind the second region.

3. The single layer dynamic loop of claim 1, wherein the first region and the second region are of equal height after folding.

4. The single layer dynamic loop of claim 1, wherein the first region and the second region are of different height after folding.

5. The single layer dynamic loop of claim 1, wherein the first region is a region to be folded and the second region is a region not to be folded.

6. The single layer dynamic loop of claim 1, further comprising at least one of a spacer, adhesive patch and damper, at least partially disposed on the second region.

7. The single layer dynamic loop of claim 1, further comprising a shield layered above the VCM lines.

8. The single layer dynamic loop of claim 7, wherein if the shield is layered above the VCM lines, the first region is folded toward the second region so that the shield is between the first region and the second region.

9. A single layer dynamic loop, comprising:
   a set of traces;
   voice coil motor lines; and
   an opening located below the set of traces and located above the voice coil motor lines;
   wherein the single layer dynamic loop is folded along the opening to move at least a first region of the dynamic loop in relation to a second region of the dynamic loop.

10. The single layer dynamic loop of claim 9, further comprising a pin opening located adjacent to the opening;
    wherein the single layer dynamic loop is folded along the opening by adjustment of the pin opening to move at least the first region of the dynamic loop in relation to the second region of the dynamic loop.

11. The single layer dynamic loop of claim 10, wherein the pin opening is adjusted to create a separation between the first region and the second region after folding.

12. The single layer dynamic loop of claim 9, wherein the single layer dynamic loop is folded along the opening to move at least part of the first region behind the second region.

13. The single layer dynamic loop of claim 9, wherein the first region and the second region are of equal height after folding.

14. The single layer dynamic loop of claim 9, wherein the first region and the second region are of different height after folding.

15. The single layer dynamic loop of claim 9, wherein the first region is a region to be folded and the second region is a region not to be folded.

16. The single layer dynamic loop of claim 9, further comprising at least one of a spacer, adhesive patch and damper, at least partially disposed on the second region.

17. A single layer dynamic loop, comprising:
    traces;
    voice coil motor (VCM) lines disposed below the traces;
    a first slit located below the traces; and
    a second slit located below the first slit and above the VCM lines;
    wherein the single layer dynamic loop is initially folded along the first slit and subsequently is folded along the second slit.

18. The single layer dynamic loop of claim 17, wherein the single layer dynamic loop is accordion folded along the first slit and then the second slit.

19. The single layer dynamic loop of claim 17, further comprising a ground shield disposed between the first slit and the second slit,
    wherein the single layer dynamic loop is folded along the first slit to move at least part of the ground shield behind the traces and then the single layer dynamic loop is folded along the second slit to cover the ground shield with a bottom portion of the single layer dynamic loop.

* * * * *